US012615058B2

(12) United States Patent
Breskvar et al.

(10) Patent No.: US 12,615,058 B2
(45) Date of Patent: Apr. 28, 2026

(54) HIGH FREQUENCY, LOW POWER, N-PATH SIGMA-DELTA MODULATOR

(71) Applicant: Beyond Semiconductor, d.o.o., Ljubljana-Crnuce (SI)

(72) Inventors: Matjaz Breskvar, Ljubljana (SI); Drago Strle, Ljubljana (SI)

(73) Assignee: Beyond Semiconductor, d.o.o., Ljubljana-Crnuce (SI)

( * ) Notice: Subject to any disclaimer, the term of this patent is extended or adjusted under 35 U.S.C. 154(b) by 97 days.

(21) Appl. No.: 18/494,541

(22) Filed: Oct. 25, 2023

(65) Prior Publication Data

US 2024/0187019 A1     Jun. 6, 2024

Related U.S. Application Data

(60) Provisional application No. 63/419,183, filed on Oct. 25, 2022.

(51) Int. Cl.
*H03M 3/00* (2006.01)

(52) U.S. Cl.
CPC ........... *H03M 3/462* (2013.01); *H03M 3/422* (2013.01)

(58) Field of Classification Search
CPC ...... H03M 3/462; H03M 3/422; H03M 3/508; H03M 3/496
USPC ................................................. 341/143, 155
See application file for complete search history.

(56) References Cited

U.S. PATENT DOCUMENTS

| 2015/0171890 | A1* | 6/2015 | Pagnanelli | ............ | H03M 3/468 |
| | | | | | 341/143 |
| 2018/0241409 | A1* | 8/2018 | Dagher | ................. | H03M 3/396 |
| 2019/0238373 | A1* | 8/2019 | Singer | ................. | H04B 7/0617 |

OTHER PUBLICATIONS

International Preliminary Report on Patentability (IPRP) issued by the International Bureau of WIPO for International Application No. PCT/IB2023/060775, mailed Feb. 2, 2024, 12 pages.
International Search Report and Written Opinion issued by the European Patent Office (EPO) for International Application No. PCT/IB2023/060775, mailed Feb. 2, 2024, 12 pages.
Balsara P. T et al., "All-Digital TX Frequency Synthesizer and Discrete-Time Receiver for Bluetooth Radio in 130-nm CMOS," IEEE Journal of Solid-State Circuits, vol. 39, No. 12, Dec. 2004, XP011122662, pp. 2278-2291.
Chen et al., "A Cost-Effective Digital Front-End Realization for 20-bit ΣΔ DAC in 0.13um CMOS," IEEE 2007 Custom Integrated Circuits Conference (CICC), XP031507568, pp. 447-450.
H. Darabi, A. Mirzaei, and M. Mikhemar, "Highly integrated and tunable RF front ends for reconfigurable multiband transceivers: A tutorial," IEEE Trans. Circuits Syst. I, Reg. Papers, vol. 58, No. 9, Sep. 2011, pp. 2038-2050.
J. Ryckaert, J. Borremans, B. Verbruggen, L. Bos, C. Armiento, J. Craninckx, G. Van der Plas, "A 2.4 GHz Low-Power Sixth-Order RF Bandpass ΣΔ Converter in CMOS," IEEE JSSC, vol. 44, No. 11, pp. 2873-2880.

(Continued)

*Primary Examiner* — Jean B Jeanglaude
(74) *Attorney, Agent, or Firm* — Sprinkle IP Law Group

(57)     ABSTRACT

Systems and methods provide architectures for various applications, for example, for software defined radios and other high frequency (HF) application. Embodiments can provide novel multi path ΣΔ architectures that form the basis for novel N path Sigma Delta (NΣΔ) modulators, NΣΔ digital to analog converters (NΣΔ DAC) and NΣΔ analog to digital converters (NΣΔ ADC).

20 Claims, 19 Drawing Sheets

(56) References Cited

OTHER PUBLICATIONS

G Molina-Salgado, A. Morgado, G. J. Dolecek, J. M. de la Rosa, "LC-Based Bandpass Continuous-Time Sigma-Delta Modulators With Widely Tunable Notch Frequency," IEEE TCAS I, vol. 61, No. 5, May 2014, pp. 1442-1455.

M.N. Hasan, S. Saeedi, Q. J. Gu, H. H. Sigmarsson, X. Liu, "Design Methodology of N-Path Filters With Adjustable Frequency, Bandwidth, and Filter Shape," IEEE Trans. on Microwave Theory and Techniques, vol. 66, No. 6, Jun. 2018, pp. 2775-2790.

Y. Zhang, P. R. Kinget, K.P. Pun, "A 0.032-mm2 43.3-fJ/Step 100-200-MHz IF 2-MHz Bandwidth Bandpass DSM Based on Passive N-Path Filters," IEEE JSSC, vol. 55, No. 9, Sep. 2020, pp. 2443-2455.

P. Karami, B. Bahmanesh, S. M. Atarodi, "An N-Path Filter Design Methodology With Harmonic Rejection, Power Reduction, Fold-back Elimination, and Spectrum Shaping," IEEE TCAS I, vol. 67, No. 12, Dec. 2020, pp. 4494-4506.

K. Koli, S. Kallioinen, J. Jussila, P. Sivonen, A. Parssinen, "A 900-MHz Direct Delta-Sigma Receiver in 65-nm CMOS," IEEE JSSC, vol. 45, No. 12, Dec. 2010, pp. 2807-2818.

R. Yu, Y. P. Xu, Band-pass Sigma-Delta Modulator Employing SAW Resonator as Loop Filter, IEEE TCAS I, vol. 54, No. 4, Apr. 2007, pp. 723-735.

R. Yu, Y. P. Xu, "Electromechanical-Filter-Based Bandpass Sigma-Delta Modulator," IEEE TCAS II, vol. 56, No. 7, Jul. 2009, pp. 550-554.

F. Hakim, T. Tharpe, R. Tabrizian, "Ferroelectric-on-Si Super-High-Frequency Fin Bulk Acoustic Resonators with Hf0.5Zr0.5O2 Nanolaminated Transducers," IEEE Microwave and Wireless Components Letters, vol. 31, No. 6, Jun. 2021, pp. 701-705.

* cited by examiner

HIGH FREQUENCY, LOW POWER, N-PATH SIGMA-DELTA MODULATOR

CROSS-REFERENCE TO RELATED APPLICATION(S)

This application claims a benefit of priority under 35 U.S.C. § 119(e) from U.S. Provisional Application No. 63/419,183, filed Oct. 25, 2022, entitled "NPATH FILTER BASED LOW POWER, HIGH FREQUENCY SIGMA-DELTA ADC," which is fully incorporated by reference herein, including all appendices, for all purposes.

TECHNICAL FIELD

This disclosure relates generally to Analog/Digital Converters (ADC). More particularly, this disclosure relates to embodiments of systems and methods for efficient, performant, and reduced size ADC, among other advantages.

BACKGROUND

Modern communication circuits utilize (e.g., software defined) radio and other high frequency (HF) circuits. ADCs (analog-to-digital converters) are critical parts of such systems. Some very demanding characteristics are high frequency operation limited by available technology, allowed power consumption, programmability, Noise Figure (NF), flicker noise attenuation in base-band (BB), attenuation of blockers, linearity, dynamic range, reliability, cost, and many others.

Because of power consumption, cost, size, reliability, stability, and software programmability, it is desired in many cases to place the ADC as close to the antenna as possible. In the past different architectures of HF receivers were tried to achieve that goal. Most popular were different kinds of super heterodyne receivers, where HF signal after the antenna is first amplified using LNA (low-noise-amplifier), followed by band pass (BP) filters and different kind of mixers, intermediate frequency (IF) filters and ADCs, all operating in analog domain. The ADC in such architectures is rather low frequency analog-to-digital converter, followed by a Digital Signal Processor (DSP). In the past, many different communication systems were built in this way.

Such systems possess some limiting characteristics. Numerous HF BP filters (SAW or BAW) tuned at different frequencies are needed in front of a LNA to accommodate different center frequencies. Unfortunately, currently they cannot be integrated on the same silicon chip as the rest of the communication system, so they are built as discrete chips, which are usually added in front of the LNA. Although SAW/BAW filters do not need power for their operation, the power consumption is prohibitively high because of large parasitic capacitances associated with packaging and the PCB. In addition, amplification is usually needed, which requires high power consumption at high frequencies. Thus, the cost and volume of such implementations are high. Furthermore, SAW/BAW filters are designed and implemented for specific frequency and are inherently not programmable (sometimes only slightly adjustable).

Other types of filters require even larger power consumption for their operation at high frequencies, their stability over PVT (process, voltage, temperature) is difficult to control, and their programmability is difficult. If an LNA is connected in front of a SAW/BAW band-pass (BP) filter to improve NF, the linearity is compromised because large blockers close to the band of interest compress the range of the LNA. If an LNA is placed after BP filters, the noise increases. In such systems, an ADC usually digitizes a relatively low frequency IF signal using a BP sigma-delta ADC. Increasing the speed of the ADC makes it possible to move the ADC closer to the antenna, however the price paid is high power consumption. Moreover, the speed is still limited by available technology. Recent BiCMOS and nm CMOS SOI technologies provide the opportunity to increase the speed of the ADC at reduced power consumption using appropriate architectures and low power circuits, and bring ADC closer to the antenna.

BP $\Sigma\Delta$ ADC play an important role in today's communication systems, software-defined radio, and other high frequency circuits, where the analog to digital conversion is needed. The power consumption, the flexibility, and silicon area are among the hardest performance parameters that are not easy to reach at high frequency because of technology and architecture limitations. High frequency operation requires high power consumption and large silicon area. Commercially available BP $\Sigma\Delta$ ADC devices suitable for HF operation typically have a high power consumption that is often prohibitive. In addition, available solutions make programmability difficult and limited, etc.

Therefore, there is a need to techniques that overcome these problems in the art. The sigma delta technique may be used to construct digital to analog and analog to digital $\Sigma\Delta$ modulators. This disclosure describes novel multi path $\Sigma\Delta$ architectures that may be the basis for novel N-path Sigma Delta (N$\Sigma\Delta$) modulators, N$\Sigma\Delta$ digital to analog converters (N$\Sigma\Delta$ DAC) and N$\Sigma\Delta$ analog to digital converters (N$\Sigma\Delta$ ADC). The "N-path" in the naming of N$\Sigma\Delta$ modulators, N$\Sigma\Delta$ DAC's and N$\Sigma\Delta$ ADC's in this disclosure is due to multi path (N-path) nature of the disclosed embodiments. While certain portions may have certain similarities with particular N-path architectures the "N-path" naming in the disclosure stands for the general concept of multi path architectures and it may refer to any N-path architecture, including N-path SS (N-path Spectral Shaping), Reflection Mode N-path, etc., as one skilled in the art would understand.

BRIEF DESCRIPTION OF THE FIGURES

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description as included in the Appendix. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

As mentioned above, this disclosure describes various embodiments of multi path ΣΔ architectures that may form the basis for novel N-path Sigma Delta (NΣΔ) modulators, NΣΔ digital to analog converters (NΣΔ DAC) and NΣΔ analog to digital converters (NΣΔ ADC), or for use with other applications, as one skilled in the art would understand.

Figure 1A:
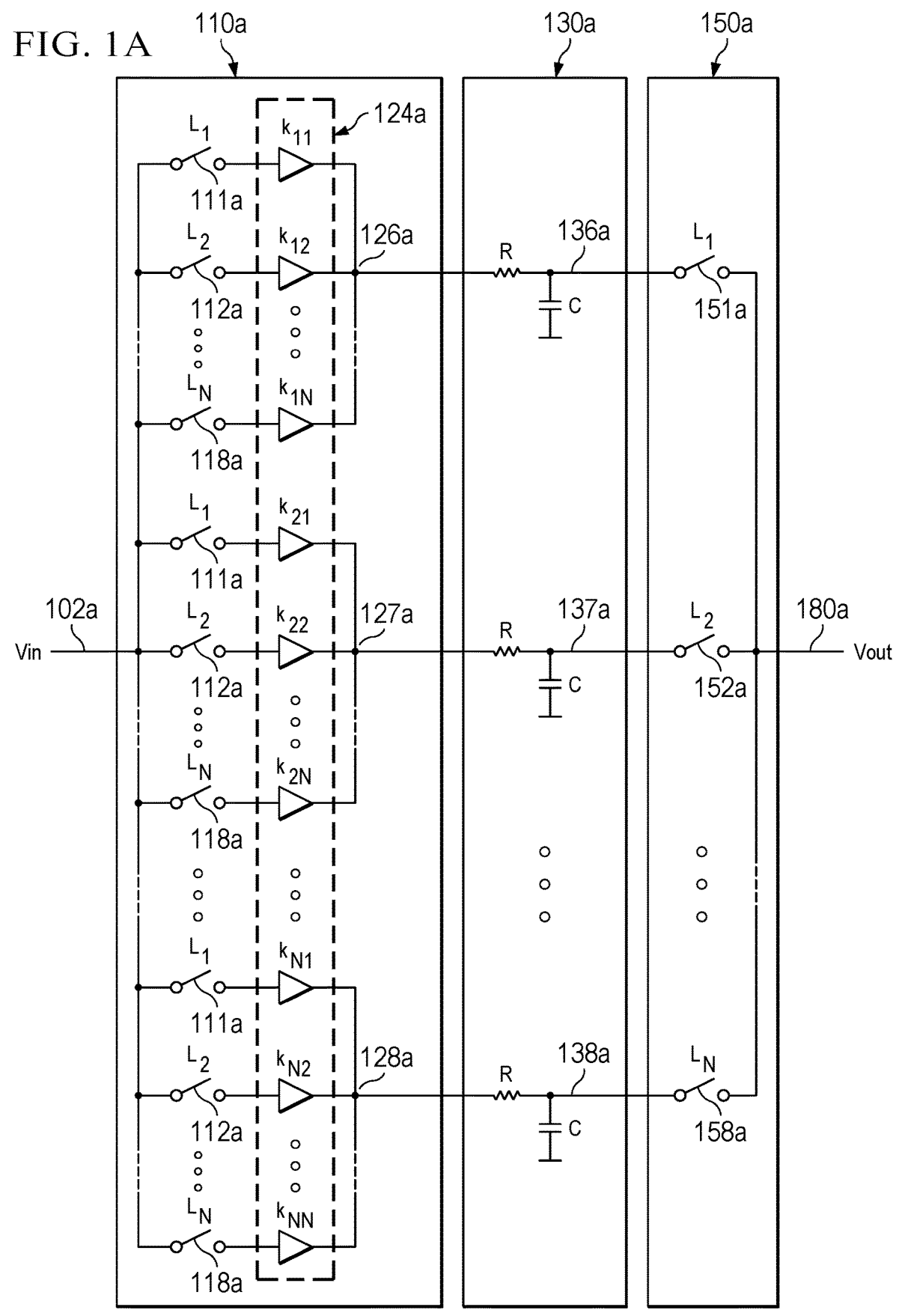
FIGS. 1A and 1B are diagrams depicting exemplary structure of an N-path Spectral Shaping filter.
Figure 1B:
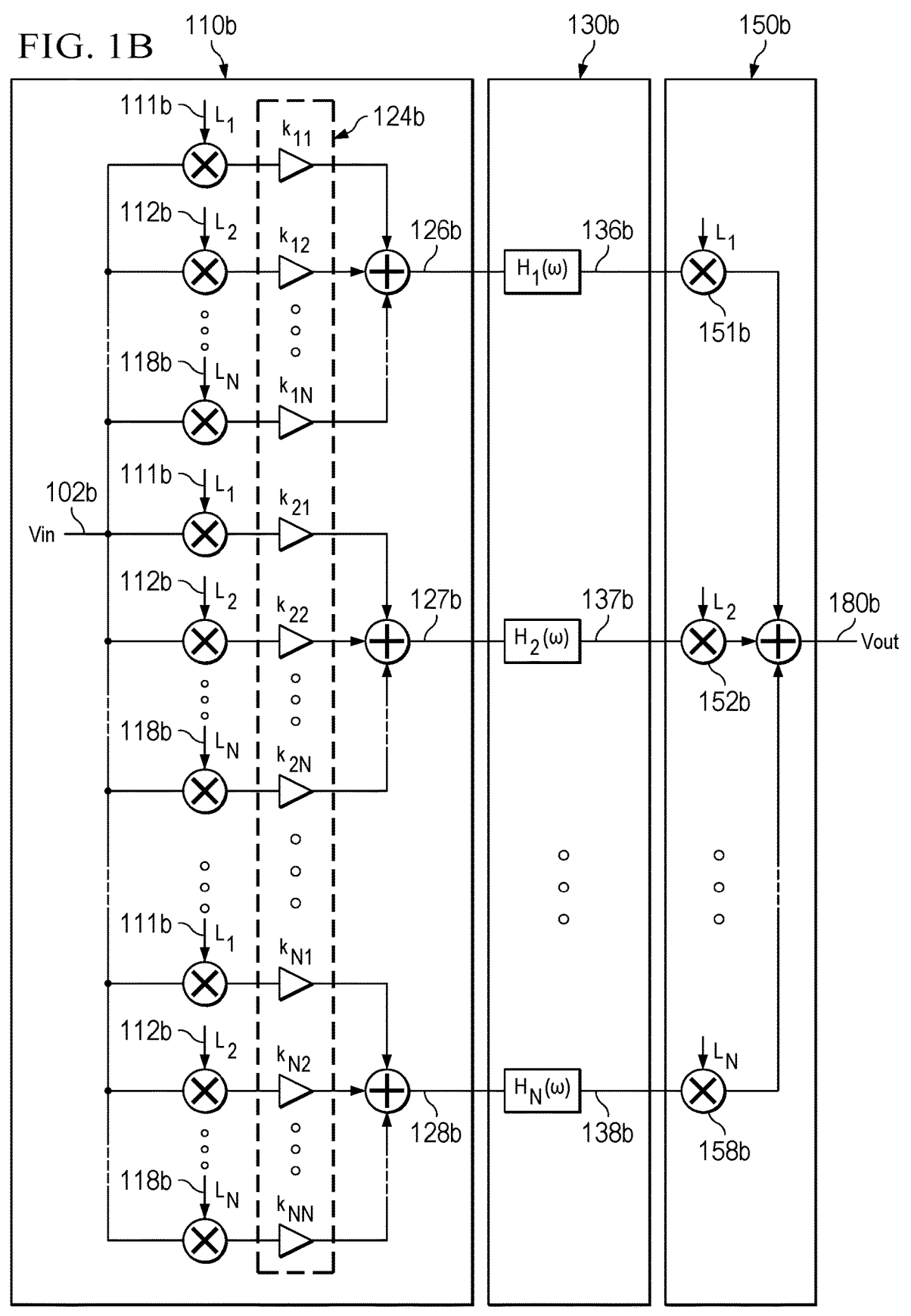

FIGS. 1A and 1B are diagrams depicting exemplary structure of an N-path Spectral Shaping filter, and how it may be realized in a circuit, and most importantly, to show how it may be decomposed into multiple functional sub-blocks.

FIG. 1B shows a simplified model of an N-path filter that improves harmonic rejection, spectral shaping and fold-back reduction. The N-path filter may be decomposed into three (3) conceptual parts (e.g., 110b, 130b, 150b), described below.

The N-path down conversion part (110b) comprises input (102b), input signal (102b) gating (mixing) with non-overlapping phases $L_1$ (111b), $L_2$ (112b), . . . , $L_N$ (118b) and scaling of such gated signals (124b) with coefficients $k_{11}$, $k_{12}$, . . . , $k_{1N}$, . . . , $k_{NN}$, resulting in multiple outputs (126b), (127b) and (128b). It will be clear to one skilled in the art that there may be an arbitrary number of outputs of the N-path down conversion part.

The N-path filter part (130b) comprises a filter (usually low pass or band pass) applied to each of its inputs (126b, 127b and 128b) to produce its outputs (136b, 137b, . . . , 138b). It will be clear that there may be an arbitrary number of outputs of the N-path filter part.

The N-path up conversion part (150b) comprises inputs (136b, 137b, . . . , 138b), gating (mixing) of inputs (136b, 137b, . . . , 138b) with the appropriate phases (151b, 152b, . . . , 158b) and output (180b).

FIG. 1A shows a simplified circuit diagram of an N-path filter corresponding to a simplified model of the N-path filter shown in FIG. 1B and comprising. The simplified circuit diagram of an N-path filter may include three (3) conceptual parts (e.g., 110a, 130a, 150a), described below.

The N-path down conversion part (110a) comprises input (102a), input signal gating (mixing) with non-overlapping phases $L_1$ (111a), $L_2$ (112a), . . . , $L_N$, (118a) and scaling of such gated signals (124a) with coefficients $k_{11}$, $k_{12}$, . . . , $k_{1N}$, . . . , $k_{NN}$ resulting in multiple outputs (126a), (127a) and (128a). It will be clear to one skilled in the art that there may be an arbitrary number of outputs of the N-path down conversion part.

The N-path filter part (130a) comprises a filter (usually low pass or band pass, on the figure shown as RC filter) applied to each of its inputs (126a, 127a and 128a) to produce its outputs (136a, 137a, 138a). It will be clear that there may be an arbitrary number of outputs of the N-path filter part.

The N-path up conversion part (150a) comprises inputs (136a, 137a, . . . , 138a), gating (mixing) of inputs (136a, 137a, 138a) with the appropriate phases (151a, 152a, . . . , 158a) and output (180a).

Note that the mixers that have one input tied to phases $L_1$ (111b), $L_2$ (112b), . . . , $L_N$ (118b) and $L_1$ (151b), $L_2$ (152b), . . . , $L_N$ (158b) may be implemented, for example, as switches, full mixers, etc., as one skilled in the art would understand.

Figure 1C:
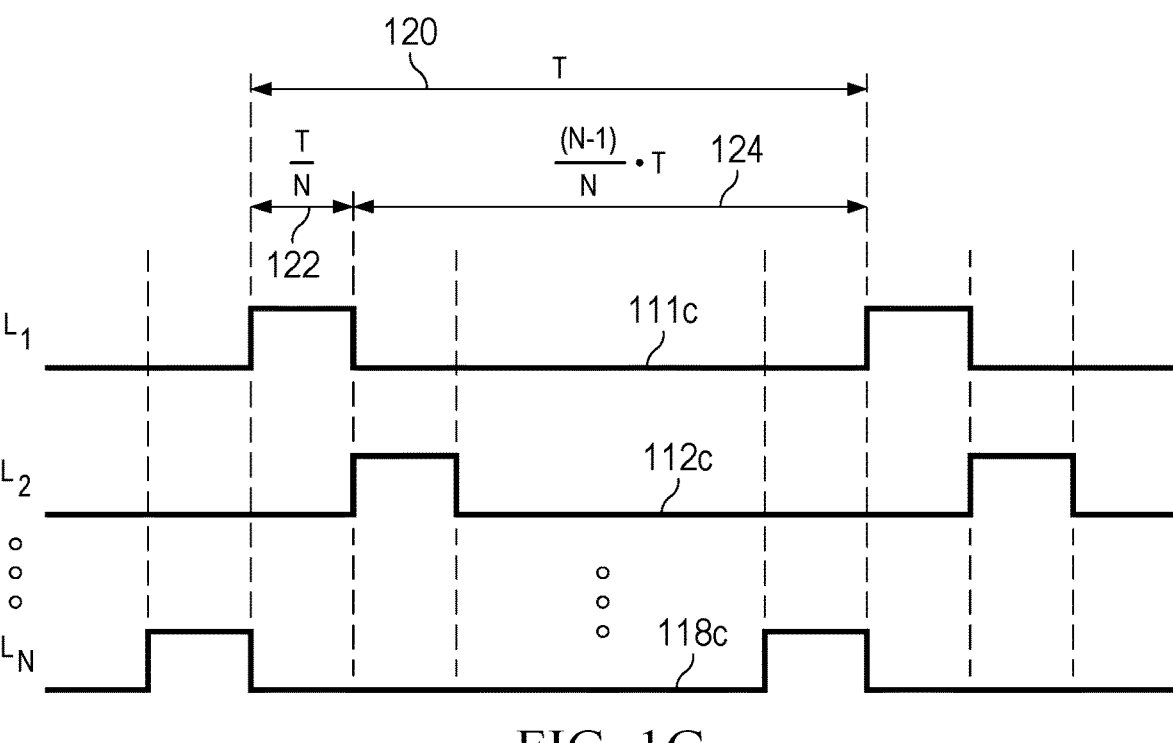
FIG. 1C depicts a timing diagram showing possible realization of phases.

FIG. 1C is a timing diagram showing possible realization of the phases, which may be clocks with particular duty cycles and phase relations among them. Specifically, the phases may be described by the repetition period T (120), the on (e.g., high) state duration T/N (122) and an off (e.g., low) state duration of $$\frac{(N-1)}{N}T,$$

where N is the number of phases. A possible relation between the phases and the behavior of the phase signals may be as shown in FIG. 1C (111c, 112c, 118c). In one example, the second phase $L_2$ (112c) may be a time shifted copy of the first phase $L_1$ (111c). The time shift (delay) may be T/N. The phases may sometimes be referred to as clocks or pulses.

In certain embodiments the phases may be overlapping. In certain embodiments the phases may be non-overlapping or even a combination of overlapping and non-overlapping. In some embodiments, it may be beneficial that the phases are strictly non-overlapping. Other (e.g., overlapping) embodiments are also possible. It may be beneficial that the phases are merely time-shifted (delayed) copies of each other (so that the difference between the phases may only be appropriate time delay). Sometimes it may be beneficial that the phases are more complex, with non-uniform on duration, etc. Sometimes it may be beneficial to consider phases as clocks (with non 50:50 duty cycle). It may also be beneficial to derive the phases from a high frequency clock.

Figure 2:
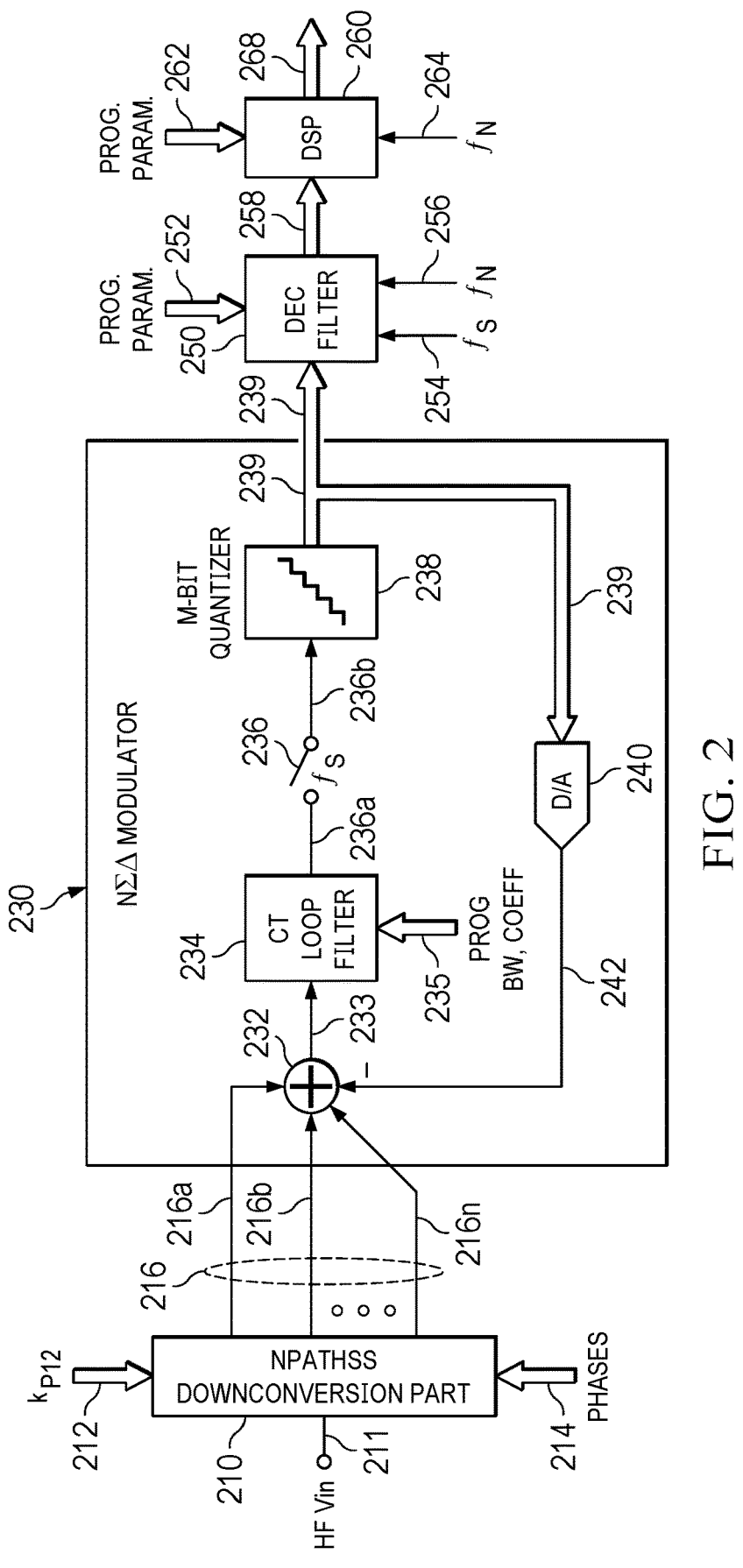
FIG. 2 depicts a diagram showing a high-level conceptual diagram of analog-to-digital N$\Sigma\Delta$ modulator.

FIG. 2 depicts a diagram showing a high-level conceptual diagram of analog-to-digital NΣΔ modulator. The analogto-digital NΣΔ modulator (230) comprises various components, described below. The operation of the modular (230) is also described below.

One or multiple distinct usually analog inputs (216*a*, 216*b*, . . . , 216*n*) are shown in FIG. 2. Note that terms used in this description, such as "usually analog," "usually digital," "usually high frequency," etc., are used merely to convey that while a particular signal may typically be one way (analog or digital; high frequency or low frequency, etc.) in a particular embodiment, in other embodiments, the signal may be the opposite, as one skilled in the art would understand.

FIG. 2 also shows combining (summation/integration) circuitry (232), with one or multiple distinct usually analog inputs (216*a*, 216*b*, . . . , 216*n*). Also shown are at least one feedback signal input (242) and usually analog output (233). A continuous time (CT) loop filter (234), with usually analog input (233), generates usually analog output (236*a*) and may use optional parameters to program CT loop filter characteristics (235). FIG. 2 also shows sampling (236) and at least one-bit quantizing circuitry (238) with input (236*a*) and at least one bit usually digital output (239). FIG. 2 also shows digital to analog conversion circuitry (240) with usually digital input (239) and analog feedback output (242), which may be inverted (negated) already as part of digital to analog conversion circuitry (240).

The analog-to-digital NΣΔ modulator (230) shown in FIG. 2 operates as follows. One or multiple distinct usually analog inputs (216*a*, 216*b*, . . . , 216*n*) are combined (summed) with the feedback input (242). The feedback input may be inverted (negated) as part of D/A converter (240). The feedback input may also not be inverted and instead subtracted from the sum of the remaining input signals (216*a*, 216*b*, . . . , 216*n*).

The CT loop filter (234) applies in principle an arbitrary signal transfer function that is usually has a low pass (LP) or band-pass (BP) characteristics to its input (233) to produce an output (236*a*). The applied signal transfer function may be programmed (dynamically altered) depending on input parameters (235). Such programmability is optional and may not be always implemented.

The sampling circuitry (236) and at least one-bit quantizer (238) may perform conversion from analog input signal (236*a*) to usually digital output signal (239). This functionality may be performed with sample and hold circuitry or otherwise. To understand the meaning of analog and digital it may be helpful to consider digital signals as inherently analog but with some encoding. The digital to analog conversion circuitry (240) converts usually digital (encoded) input signal (239) into analog output (242). The digital to analog conversion circuitry (240) may already invert (negate) the usually digital input (239) as part of digital to analog conversion. The analog output (242) may be inverted (negated) and may form the sigma delta negative feedback loop feeding into (232).

Note that, in this description, referencing multiple structures or path, as in the example of analog inputs (216*a*, 216*b*, . . . , 216*n*) in FIG. 2, the numbering does not imply that there are, for example, 14 analog inputs (a, b, c, d, e, f, g, h, l, j, k, l, m, n) but that there are N such analog inputs (arbitrary finite integer number).

Figure 2A:
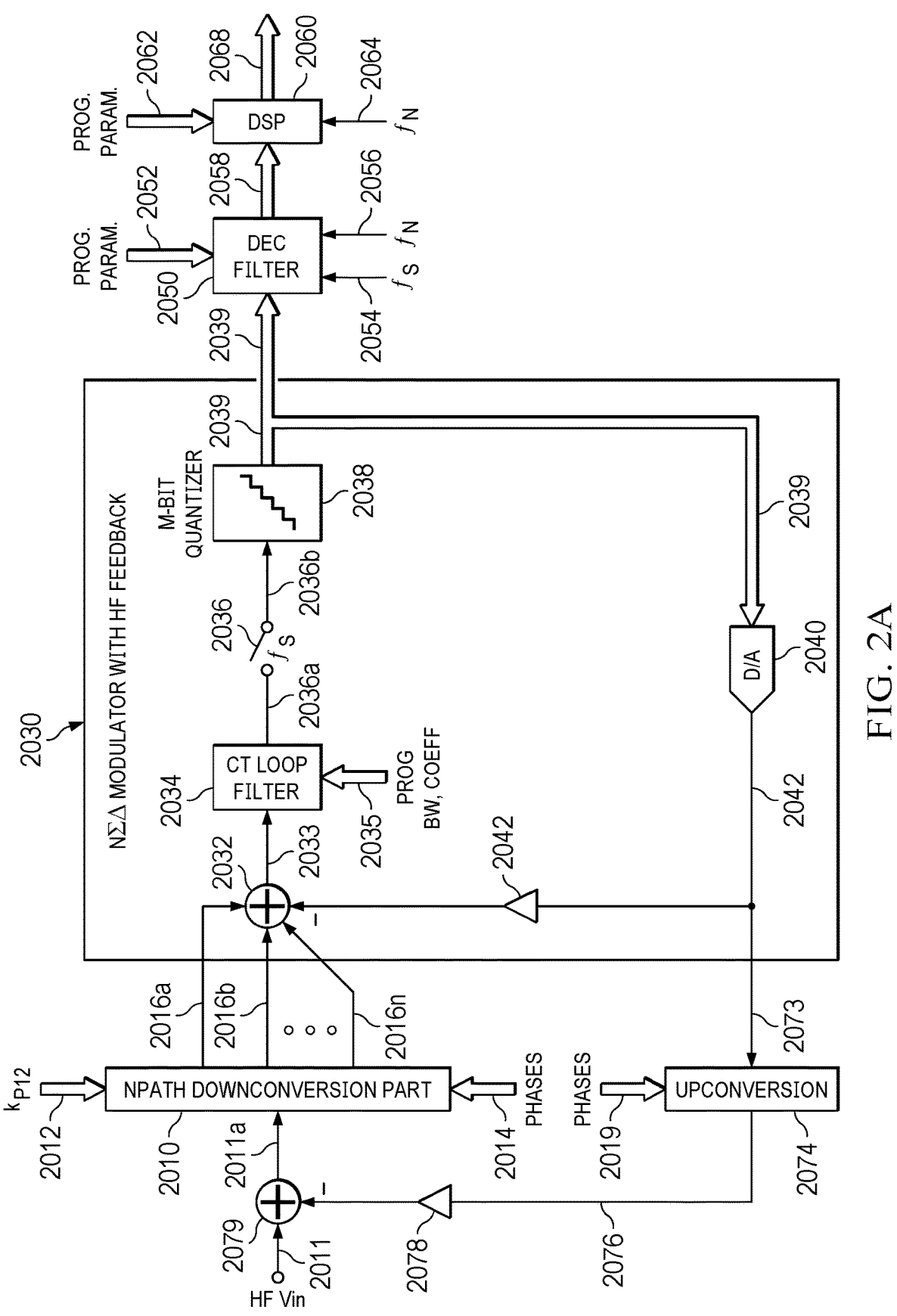
FIG. 2A depicts a high-level conceptual diagram of an analog-to-digital N$\Sigma\Delta$ modulator with additional feedback output.

FIG. 2A depicts a diagram showing a high-level conceptual diagram of an analog-to-digital NΣΔ modulator (2030) with additional feedback output (2073). The analog-to-digital NΣΔ modulator (2030) comprises various components, described below. The operation of the modular (2030) is also described below.

One or multiple distinct usually analog inputs (2016*a*, 2016*b*, . . . , 2016*n*) are shown in FIG. 2A. FIG. 2A also shows combining (summation) circuitry (2032) with one or multiple distinct usually analog inputs (2016*a*, 2016*b*, . . . , 2016*n*) and at least one feedback signal input (2042) and usually analog output (2033). FIG. 2A also shows continuous time (CT) loop filter (2034) with usually analog input (0233), usually analog output (2036*a*), and optional parameters to program CT loop filter characteristics (2035).

FIG. 2A also shows sampling (2036) and at least one-bit quantizing circuitry (2038) with input (2036*a*), and at least one bit usually digital output (2039). FIG. 2A also shows digital to analog conversion circuitry (2040) with usually digital input (2039) and analog feedback output (2042), that may be inverted (negated) already as part of digital to analog conversion circuitry (2040). FIG. 2A also shows an additional feedback output (2073).

The analog-to-digital NΣΔ modulator (2030), with additional feedback output (2073), shown in FIG. 2*a* operates as follows. One or multiple distinct usually analog inputs (2016*a*, 2016*b*, . . . , 2016*n*) are combined (summed) with the feedback input (2042). The feedback input may be inverted (negated) as part of D/A converter (2040). The feedback input may also not be inverted and instead subtracted from the sum of the remaining input signals (2016*a*, 2016*b*, . . . , 2016*n*).

The CT loop filter (2034) applies in principle an arbitrary signal transfer function that is usually has a low pass (LP) or band-pass (BP) characteristics to its input (2033) to produce an output (2036*a*). The applied signal transfer function may be programmed (dynamically altered) depending on input parameters (2035). Such programmability is optional and may not be always implemented, as one skilled in the art would understand.

The sampling circuitry (2036) and at least one-bit quantizer (2038) may perform conversion from analog input signal (2036*a*) to usually digital output signal (2039). This functionality may be performed with sample and hold circuitry or otherwise. To understand the meaning of analog and digital it may be helpful to consider digital signals as inherently analog but with some encoding.

The digital to analog conversion circuitry (2040) converts usually digital (encoded) input signal (2039) into analog output (2042). The digital to analog conversion circuitry (2040) may already invert (negate) the usually digital input (2039) as part of digital to analog conversion. The analog output (2042) may be inverted (negated) and may form the sigma delta negative feedback loop feeding into (2032). In some embodiments, the additional feedback output (2073) may be a copy of feedback signal (2042).

A complete mixed-signal NΣΔ ADC may be built according to FIG. 2 and/or FIG. 2*a* by combining elements of the N-path filter (specifically the N-path down conversion part) with the CT (Continuous Time) ΣΔ modulator. The N-path part may be used to filter and amplify the incoming signal and move it to the BB (base-band), while the CT (Continuous Time) ΣΔ modulator may serve the following purposes: high order filtering of the signal coming from the N-path down conversion part or the N-path filter, further amplification and conversion of BB (Base-Band) signal, and conversion to digital domain, where further precise digital signal processing may be performed. The DSP may precisely adjust the amplitude/phase characteristics. By selecting appropriate architecture of the N-path down conversion part, the whole arrangement may provide narrow band BP filtering with amplification at the center frequency, which may replace LNA (low-noise amplifier) and passive or SAW filters which are used in "classical" RF receivers. Therefore, there is a possibility to connect the NΣΔ ADC directly to the antenna. In addition, the arrangement may reduce the distortions at the presence of blockers, since they may be first attenuated with programmable narrow-band filter and then amplified. It may also be possible to program the center frequency and the bandwidth. The power consumption may also be reduced in this way.

Disclosed in this description are several innovations described in continuation that solve some of the problems discussed above, and make embodiments of an RF NΣΔ modulator more efficient with smaller power consumption and better performances at high frequencies, if integrated on an appropriate silicon substrate. Therefore, using the disclosed embodiments, it is possible to move an ADC closer to an antenna.

The N-path down conversion part of the NΣΔ ADC presented in the FIG. 2 may execute signal operation which may be expressed in the time-domain as described by the Formula below (hereafter referred to as Formula F). Each complex signal from individual groups of mixers may be filtered by h(t), which is part of the CT STF (Signal Transfer Function) of the CT ΣΔ modulator. This operation constitutes one of the innovations described in this disclosure.

$$v_{out,p}(t) = \sum_{p=1}^{N}\sum_{q=1}^{N}[(v_{in}(t)K(p,q)S_{D,q}(t)) * h_p(t)];$$

where:

$$K = \begin{bmatrix} k_{11} & \cdots & k_{1N} \\ \vdots & \ddots & \vdots \\ k_{N1} & \cdots & k_{NN} \end{bmatrix};$$

$K(p,q)=k_{pq}$ is a weight of path p for phase q $$S_{D,1}(t) = \begin{cases} 1 & iT \le t < \left(i + \frac{1}{N}\right)T, i \in Z \\ 0 & \text{otherwise} \end{cases}$$

$$S_{d,q}(t) = S_{D,1}\left(t - \frac{q-1}{N}T\right), q = 2, 3, \dots N$$

Pertaining to FIG. 1B, the above Formula F may describe the signals on outputs (136b, 137b, . . . , 138b) in dependence on phases (111b, 112b, . . . , 118b), coefficients (124b) and the input signal (102b). Specifically:

$v_{out,p}(t)$ may be the time dependent behavior of the output (136b, 137b, . . . , 138b), where the index p may enumerate the paths, such that $v_{out,1}(t)$ may describe the time dependent behavior of the output (136b), $v_{out,2}(t)$ may describe the time dependent behavior of the output (137b), and so on till $v_{out,N}(t)$ may describe the time dependent behavior of the output (138b)

$v_{in}(t)$ may be the time domain behavior of the input (102b)

$K(p,q):=k_{pq}$ may be a weight coefficient of path p for phase q (124b)

$S_{D,q}(t)$ may describe the behavior of phase q. The behavior of the first phase (111b) in FIG. 1B may be described by $S_{D,1}(t)$, the second phase (112b) may be described by $S_{D,2}(t)$, etc.

"*" in the Formula F may denote convolution $h_p(t)$ may be the time domain description of filters (130b). The conversion between time domain description frequency domain description $H_p(\omega)$ may be performed using Fourier transform.

It will be clear to one skilled in the art how to apply the Formula F to the relevant parts of each of the embodiments described. Pertaining to FIG. 2, the $v_{out,p}(t)$ in the Formula F may describe time dependent behavior of the outputs (216), in dependence on phases $S_{D,q}(t)$ (214), coefficients K(p,q) (212) and input signal $v_{in}(t)$ (211). If the filters are not present the Formula F simplifies accordingly.

Pertaining to FIG. 3 (described below), the $v_{out,p}(t)$ in the Formula F may describe time dependent behavior of the outputs (316a, 316b, . . . , 316n), in dependence on phases $S_{D,q}(t)$ marked in the FIG. 3 as L1, L2, . . . , LN inside (312, 314, . . . , 318), the coefficients K(p,q) marked in the FIG. 3 as k11, . . . kNN inside (312, 314, . . . , 318) and input signal $v_{in}(t)$ (311). Since there are no filters inside (310) the Formula F simplifies accordingly.

Note that the various described embodiments, coefficients of matrix K are discussed (see also, Formula F above). Following is an example of one procedure to determine such coefficients. Other procedures may be implemented, as one skilled in the art would understand.

It may be beneficial for efficient implementation of the N-path structures, the selection of the center frequency, and the complete mixed-signal NΣΔ ADC to select the matrix of coefficients to be as sparse as possible while still retaining required filtering characteristics and STF of the structure. It may be of further benefit to select any and/or some of the non-zero coefficients of the matrix to exhibit symmetries and/or comprise of integers and/or comprise of coefficients that are integer multiples of other coefficients, etc. As will be apparent to one skilled in the art, a path with coefficient 0 does not need to be implemented simplifying the circuit and improving power, performance. It will also be apparent to one skilled in the art that that paths with "1" or "−1" coefficients also result in simplified and more efficient realization.

One exemplary way to select the coefficients of the coefficient matrix K in Formula F is as follows. Other ways are also possible, as one skilled in the art would understand.

1. Pick dimension N of the coefficient matrix K, starting with N=2. The larger the matrix dimensions, the more paths and the higher the potential to obtain the desired STF (e.g., filtering characteristic). In many cases, requirements may be met with low dimensions of coefficient matrix K (e.g. N<10, N=2, N=4 or N=8). Often it may be beneficial for realization to pick a dimension N which is power of 2.

2. Pick number of non-zero coefficients (NZC), starting with NZC=2.

3. Pick values for non-zero coefficients. Starting with all 1, then proceeding with a mix of 1 and −1, then add low integer coefficients, $$\pm\sqrt{2}, \pm\sqrt{3}, \dots, \cos\left(i * \frac{2\pi}{N}\right), \text{where } i = 1, \dots,$$

$$2, N, \sin\left(i * \frac{2\pi}{N}\right), \text{where } i = 1, 2, \dots, N, \text{etc.}$$

4. Systematically select positions in the matrix where to place non-zero coefficients. Start by observing simplest symmetries (e.g. matrix is symmetric, matrix is anti-symmetric, same coefficients in diagonals, arrangements of coefficients in blocks 5. For each set of N, NZC, and position of non-zero coefficients calculate or simulate the signal transfer function (e.g. by using Matlab).

6. Check if the resulting signal transfer function satisfies design criteria selected for particular design of the N-path ΣΔ ADC structure.

7. Iterate the procedure until a satisfactory result (e.g. satisfactory signal transfer function with acceptable complexity of the N-path ΣΔ ADC structure) is achieved.

While the exemplary procedure above may require significant time to perform it will lead one skilled in the art to determine and select optimal (for specific technology, use case, requirements, etc.) realization of N-path ΣΔ ADC structure. Furthermore, as evident to one skilled in the art, the procedure may be automated by, as one example, selecting a ranking function that assigns a value to each coefficient matrix (and thus N-path ΣΔ ADC structure) that satisfies required constraints on the STF. For example, the ranking function may simply count number of zero coefficients or assign the highest score to zero coefficients, lower score to paths with coefficient 1, yet lower score to paths with –1 coefficient and yet lower score to coefficients with integer values, etc. The ranking function may also take into account symmetries, etc.

Also note that usually, the more paths that need to be implemented, the harder is the realization. Thus, it is usually best to start with lowest dimension of non-zero coefficients. Also note that it will be apparent to one skilled in the art that some steps in the above procedure may be done analytically (by solving equations). It will be apparent to one skilled in the art that the overall scaling factor of the coefficient matrix may be irrelevant.

The determination of satisfactory signal transfer function may take into account all the otherwise usual trade-offs and considerations when designing an RF or mixed-signal design especially design considerations pertaining to ΣΔ ADC and modulators (in example frequency planning, noise figure, bandwidth, sampling frequency, power consumption, etc.).

It will be apparent to one skilled in the art and process technology considered (e.g. CMOS, RF SOI, FD SOI, GaN, GaAs, AlN, etc.) how to simulate and realize (implement) the physical structure corresponding to particular coefficient matrix K. It will also be apparent to one skilled in the art how to evaluate trade-offs in radio frequency (RF) and mixed signal design, including frequency planning, impact of differential architecture, etc. on characteristics of the combination of the ΣΔ ADC structure and coefficient matrix K.

Referring again to FIG. 2, FIG. 2 shows a high-level conceptual diagram of N-path ΣΔ ADC (hereafter NΣΔ ADC) that includes the NΣΔ modulator (230) discussed above. The NΣΔ ADC of FIG. 2 comprises the following items:

Input (211) where the usually High Frequency (HF) signal enters the NΣΔ ADC. The input (211) signal may be in arbitrary frequency band.

N-path down conversion part (210) with multiple outputs (216) and with characteristics dependent on phases inputs (214) and coefficients inputs (212). The N-path down conversion part (210) may have arbitrary frequency translation characteristics and/or may have additional signal transformation characteristics, harmonic rejection, spectral shaping, fold-back reduction, filtering, etc. The coefficients input (212) may be constant and may also be implemented internal to N-path down conversion part (210).

NΣΔ modulator (230) (discussed in detail above) with one or multiple distinct usually analog inputs (216a, 216b, . . . , 216n), at least one bit usually digital output (239) and optional programming inputs (235) to program the characteristics of the NΣΔ modulator (e.g. bandwidth, characteristics ΣΔ modulation, etc.).

Decimation filter (250) with the input (239) at sampling frequency (254), digital output (258) that may be at some other usually Nyquist frequency (of the input signal in base band) (256) and that may have optional input for programmable parameters (252) that may impact decimation filter (250) characteristics.

Digital Signal Processing (DSP) circuitry (260) with input (258). The DSP circuitry (260) may have programmable characteristics adjustable via parameters (262), operating at usually Nyquist frequency (264) and may have a digital output (268).

The coefficients (212) and/or phases (214) and/or CT loop filter parameters (235) and/or sampling frequency/clock (236, 254) may be fully or in part run-time programmable and/or fixed at implementation time.

The N-path ΣΔ ADC operates as follows. The usually analog HF signal on the input (211) is downconverted by the N-path down conversion part (210) usually to the base band or low IF frequency. Some, possibly distinct, higher frequency components may still be present on the outputs (216). Also, the N-path down conversion part (210) may have a different frequency translation, harmonic rejection, spectral shaping, fold-back reduction, and/or other signal transfer function characteristics not only down conversion to the base band. The N-path down conversion part (210) signal transfer function characteristics are defined by selections made on phases input (214) and coefficients inputs (212).

Many variations, optimizations and alternative implementations applicable to conventional ΣΔ ADC implementations may be adoptable by the ΣΔ ADC. These will be apparent to one skilled in the art and may all be applicable to invention. As an example, the CT loop filter implementations may differ in filter order, architecture, structure, type, etc. As further examples, the ΣΔ modulation part may be of different orders, etc.

The NΣΔ ADC may be implemented using single ended and/or differential signal paths (or combination thereof). The tradeoffs may depend on particular circumstances and will be apparent to one skilled in the art. Many variations, optimizations and alternative implementations applicable to conventional decimation and other digital signal processing are possible. These will be apparent to one skilled in the art and may all be applicable to invention.

In some embodiments, the center frequency of the input (211) signal to digitalize may be programmed by only changing the coefficients (212) and/or phases (214) while keeping the rest of the ΣΔ ADC static. In some embodiments, the bandwidth of the input (211) signal to digitalize may be programmed by only changing the CT loop filter parameters (235). In some embodiments, the center frequency and/or bandwidth may be programmed by only changing the clock from which the phases (214) may be derived and/or the sampling clocks/frequency (236, 254).

Note that the selection of parameters on the phase inputs (214) and the coefficients inputs (212) may be determined such that overall signal transfer function from input (211) to digital output (239) is such that some (e.g. unwanted or wanted) signal components are filtered out and/or attenuated and/or amplified by the CT loop filter (234) in combination with the rest of the other NΣΔ modulator components including sampling circuitry (236), quantizer (238), D/A converter (240), feedback signal (242), combining circuitry (232) and other signal propagation characteristics along the signal path from input (211) to the output (239). One exemplary procedure to determine suitable phase inputs (214) and the coefficient inputs (212) is described below.

The N$\Sigma\Delta$ ADC described above with respect to FIG. 2, in comparison to conventional 24 ADCs, provide various advantages. For example, one advantage is reduced power consumption, smaller area, lower cost, simpler implementation and better characteristics achieved because of early down conversion, harmonic rejection, spectral shaping, fold-back reduction of the input signals (211) into e.g. base band and/or lower frequency bands and/or more convenient frequency bands and/or harmonic rejection, spectral shaping, fold-back reduction (e.g. elimination of unwanted spectral components in certain Nyquist zones, etc.) and thus advantageous further signal processing, sampling and analog to digital conversion. In one example, the N$\Sigma\Delta$ ADC may directly digitalize HF input signals of runtime programmable bandwidth and center frequency utilizing only low pass CT loop filter (234) and/or low pass $\Sigma\Delta$ modulator (230) structures where traditionally more complex (and worse performing) band-pass CT loop filter and $\Sigma\Delta$ modulator may be required. Furthermore, the N$\Sigma\Delta$ modulator may be implemented in fixed under sampling and/or base band sampling and/or low frequency sampling configuration regardless of the N$\Sigma\Delta$ ADC input (211) signal characteristics as the initial N-path down conversion path may be utilized to appropriately filter and/or translate and/or perform harmonic rejection, spectral shaping, fold-back reduction in the spectrum of the input (211) signal.

Another advantage is reduced power consumption, smaller area, lower cost, simplified implementation and better characteristics achieved by combining the functionality of CT loop filter(s) (234) and N-path filter(s) (130a, 130b) in dual purpose filter structure. In the example of FIG. 2, such multi-purpose filter structure is marked as CT loop filter (234), however it performs also the function of N-path filters (130a, 130b). When advantageous due to particular circuit design, layout, technology, etc. considerations, the multi-purpose filter structure may be distributed, multi-staged, etc. and still keep the stated advantages of reduced power consumption, smaller area, lower cost, simplified implementation and better characteristics.

Implementations of filters and other $\Sigma\Delta$ ADC structures in integrated circuits, especially in the advanced ones, may suffer from big on-chip and environmental variabilities. The disclosed N$\Sigma\Delta$ ADC architecture may effectively address such variabilities as the filtering characteristics are well defined on the complete signal path. This may be achieved by programmable loop-filter coefficients in analog domain and by DSP filtering in digital domain.

Referring again to FIG. 2a, FIG. 2a shows a high-level conceptual diagram of N-path $\Sigma\Delta$ ADC (hereafter N$\Sigma\Delta$ ADC) (that includes the N$\Sigma\Delta$ modulator (2030) discussed above) with high frequency feedback loop. The N$\Sigma\Delta$ ADC of FIG. 2a comprises the N$\Sigma\Delta$ ADC as shown in FIG. 2 and with additional feedback output (2073) from modulator (2030) that is an input into frequency up conversion circuit (2074). The up-conversion circuit (2074) may be as disclosed in some embodiments and may use N-path up conversion part with phases (2019). It may also use arbitrary other up-conversion techniques to obtain high frequency feedback signal (2076) that may be further scaled (multiplied by arbitrary value) by scaler (2078) and combined with high frequency input (2011) in the first combiner (2079). The first combiner (2079) output may then be an input to an N-path down conversion part (2010) which may be equivalent to the N-path down conversion part in FIG. 2 (210). Note that the high frequency feedback (2078) may further improve the characteristics and performance of the N$\Sigma\Delta$ ADC due to bigger part of circuitry being inside of a feedback loop.

Figure 3A:
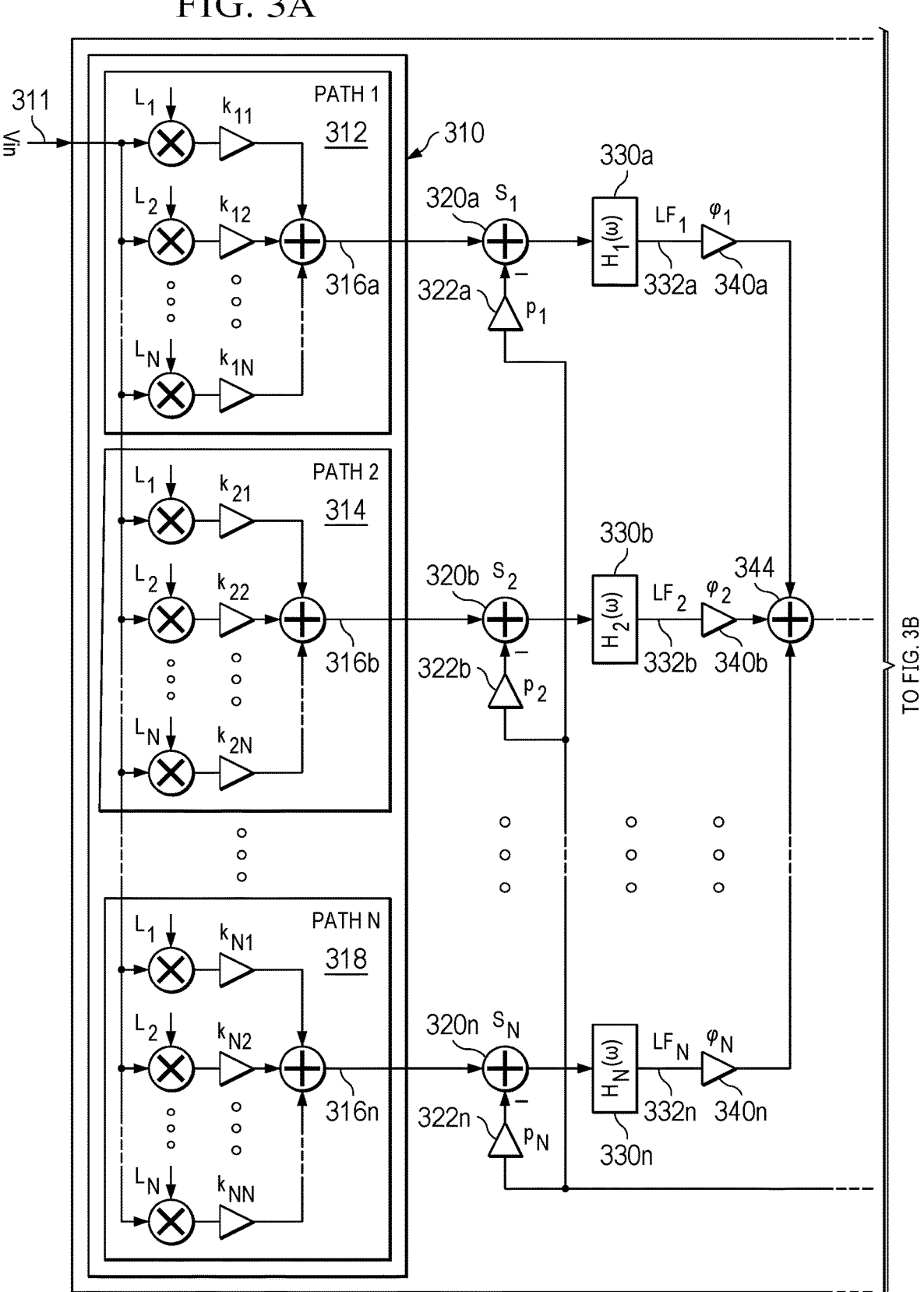
FIG. 3 (split in the figures as FIG. 3A and FIG. 3B) depicts a block diagram of an embodiment of a N$\Sigma\Delta$ ADC implemented with one quantizer.
Figure 3B:
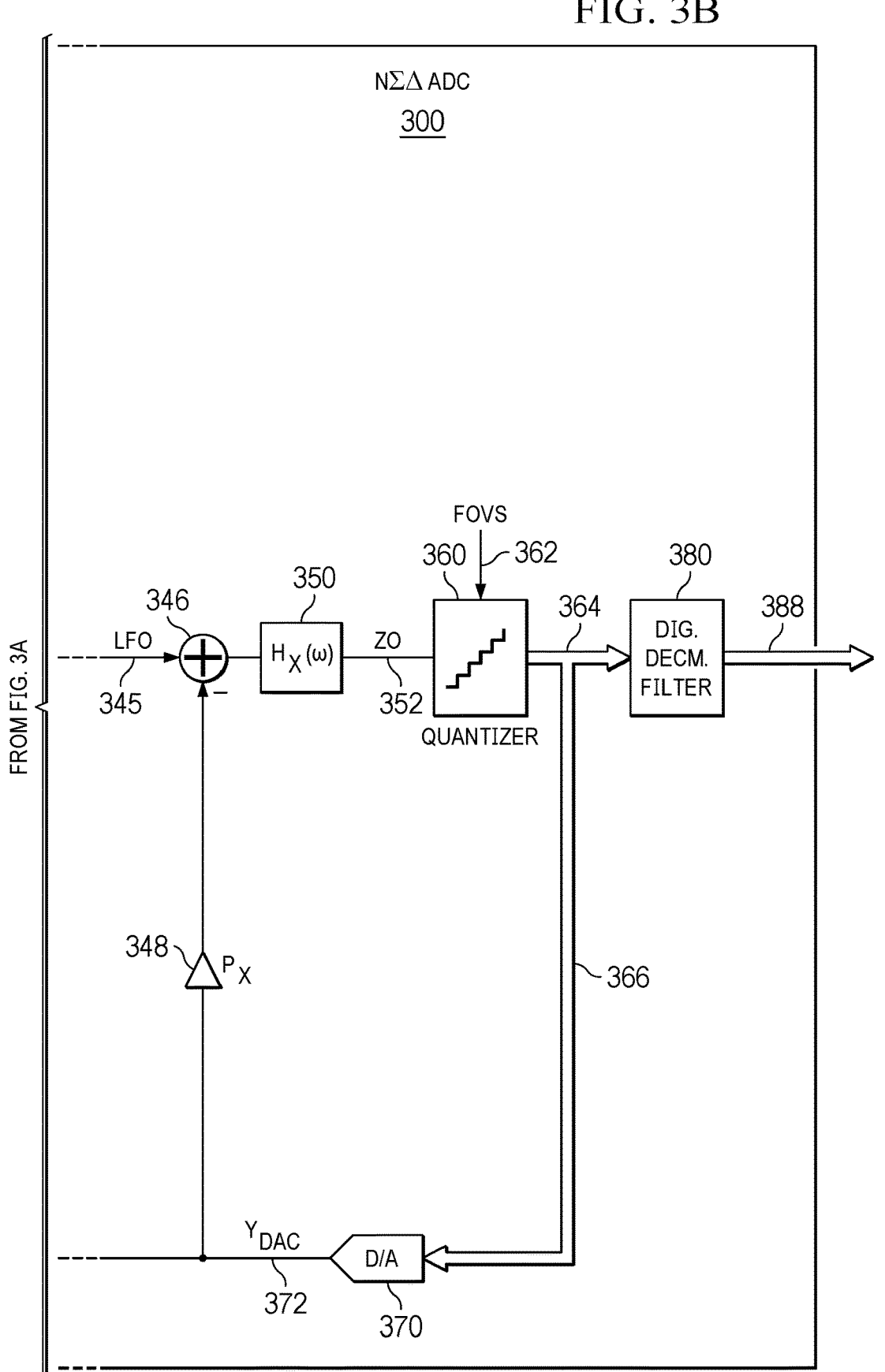

FIG. 3 depicts a block diagram of an embodiment of a N$\Sigma\Delta$ ADC implemented with one quantizer (described below). Relative to FIG. 2, the embodiment of FIG. 3 provides further detail and alternative embodiments of the N$\Sigma\Delta$ ADC. Alternative embodiments may provide additional flexibility when implementing the N$\Sigma\Delta$ ADC circuit enabling a designer to better address conflicting design trade-offs and parameters. In this example, the N$\Sigma\Delta$ ADC of FIG. 3 comprises the following items:

An HF analog input (311), which may be either differential or single ended. The difference in structure of the circuitry between these two cases (FIG. 2 and FIG. 3) will be apparent to one skilled in the art.

An N-path down conversion part (310) with input (311) and single or multiple outputs (316a, 316b, . . . , 316n). The N-path down conversion part (310) comprises of signal shaping that may or may not be distinct for each path (312, 314, . . . , 318).

An output (316a) on path 1 (312) of the N-path down conversion part (310) may be an input into first combiner (or summation) circuit (320a). An additional input (322a) into first combiner (320a) may be scaled (multiplied by arbitrary value) output (372) of the D/A converter (370).

The output of the first combiner (320a) may be an input into filter (330a). The filter (330a) may have low pass, band pass or arbitrary other characteristic. The signal of interest in the output (332a) of the filter (330a) may be at lower or otherwise more beneficial frequency band comparing to the signal of interest on the input (311) to the N$\Sigma\Delta$ ADC.

The output (332a) of the filter (330a) may be scaled (multiplied by arbitrary value) by path 1 scaler (340a) and then fed into second combiner (344).

The propagation of the N$\Sigma\Delta$ ADC input (311) through other paths of the N-path downconverter part (312) which may include signals propagating through path 2 (314), . . . , and path N (318) is analogous to propagation of the signals along the path 1 (312). Specifically:

Path 2: The output (316b) on path 2 (314) of the N-path down conversion part (310) may be an input into first combiner (or summation) circuit (320b). An additional input (322b) into first combiner (320b) may be scaled (multiplied by arbitrary value) output (372) of the D/A converter (370). The output of the first combiner (320b) may be an input into filter (330b). The filter (330b) may have low pass, band pass or arbitrary other characteristic. The signal of interest in the output (332b) of the filter (330b) may be at lower or otherwise more beneficial frequency band comparing to the signal of interest on the input (311) to the N$\Sigma\Delta$ ADC. The output (332b) of the filter (330b) may be scaled (multiplied by arbitrary value) by path 2 scaler (340b) and then fed into second combiner (344).

Path N: The output (316n) on path N (318) of the N-path down conversion part (310) may be an input into first combiner (or summation) circuit (320n). An additional input (322n) into first combiner (320n) may be scaled (multiplied by arbitrary value) output (372) of the D/A converter (370). The output of the first combiner (320n) may be an input into filter (330n). The filter (330n) may have low pass, band pass or arbitrary other characteristic. The signal of interest in the output (332n) of the filter (330n) may be at lower or otherwise more beneficial frequency band comparing to the signal of interest on the input (311) to the NΣΔ ADC. The output (332n) of the filter (330n) may be scaled (multiplied by arbitrary value) by path N scaler (340n) and then fed into second combiner (344).

The scaled outputs (340a, 340b, . . . , 340n) of one or more paths that may be inputs into second combiner (344) with single output (345).

The third combiner (346) with input (345) and negated feedback input (348) that may be scaled (multiplied by arbitrary value) value of the D/A converter (370) output (372).

The filter (350) that may have low pass, band pass or arbitrary other characteristic with input that is connected to the output of third combiner (346) and output (352) that is connected to a one or multi-bit quantizer (360). The filter (350) may be of arbitrary order.

The one or multi-bit quantizer (360) with usually analog input (352) and usually digital output (364). The sampling clock (362) may or may not be programmable.

Digital decimation filter (380) with usually digital input (364) and usually digital output (388).

D/A converter (370) with digital input (366) generating analog output (372) which is connected to one or multiple feedback loops (348, 322a, 322b, . . . , 322n) (described above).

The N-path ΣΔ ADC depicted in FIG. 3 operates as follows. The input (311) of the NΣΔ ADC may have an arbitrary frequency translation characteristic and/or may have additional signal transformation characteristics, harmonic rejection, spectral shaping, fold-back reduction, etc. applied by the N-path down conversion part (310). These transformations may be determined such to optimize the overall signal transfer function from NΣΔ ADC input (311) to NΣΔ ADC output (388) and e.g. suppress undesirable spectrum components, attenuate folding, reject out-of-band signals, etc.

The first combiners (320a, 320b, . . . , 320n) may enable positive or negative feedback loop combining each of the outputs (316a, 316b, . . . , 316n) with possibly distinct and arbitrarily scaled values (322a, 322b, . . . , 322n) of the output (372) of the D/A converter (370). Following the first combiners (320a, 320b, . . . , 320n) the signals propagating from the outputs of the first combiners (320a, 320b, . . . , 320n) may be filtered by possibly distinct first filters (330a, 330b, . . . , 330n). The filter characteristics may or may not differ between (330a, 330b, . . . , 330n) and may have low pass, band pass or arbitrary characteristic. The architecture of the filters may be arbitrary and include arbitrary order filters, passive or active filters, etc.

The outputs (332a, 332b, . . . , 332n) of the first filters (330a, 330b, . . . , 330n) may be further distinctly scaled (multiplied by arbitrary values) on each of the signal propagation paths (340a, 340b, . . . , 340n). The output of the scalers (340a, 340b, . . . , 340n) may be summed (combined) to form an output (345) by the second combiner (344). The third combiner (346) may sum (combine) the second feedback signal (348) with the output (345) of the second combiner (344). The second feedback signal (348) may be scaled (multiplied by arbitrary value) signal present on the output (372) of the D/A converter (370).

The second filter (350) may apply an arbitrary signal transform function to the output of the third combiner (346) to generate output (352). Examples of the signal transfer function may have low pass, band pass or other characteristics. The first filters (330a, 330b, . . . , 330n) and second filters (350) may perform the function of the (CT) loop filter. The transfer functions of the first filters (330a, 330b, . . . , 330n) and second filters (350) may be chosen such that it suppresses unwanted spectral components and/or boosts the signal of interest on the output (388) of the NΣΔ ADC.

The one or multi-bit quantizer (360) may sample an analog signal on input (352) with sampling frequency/clock (362) to produce a one or multi-bit digital output (364). The output (364) of the one or multi bit quantizer (360) is an input (366) into D/A converter (370). The D/A converter (370) may be used to generate the usually negative feedback loop signal (372) that may be further scaled (348, 322a, 322b, . . . , 322n). The output (364) is also an input into digital decimation filter (380) that may perform arbitrary digital filtering to produce the output (388) of the NΣΔ ADC.

Note that the advantages described with respect to the FIG. 2 architecture apply also to embodiments detailed in FIG. 3. Also note that all signal paths on the diagram are shown as single ended. However, as one skilled in the art would understand, other configurations are possible with arbitrary mix of single ended and differential signal paths as may be convenient for particular design, in particular technology and with particular specifications. The realization differences and trade-offs between single ended and differential signal paths will be apparent to one skilled in the art.

Many variations, optimizations and alternative implementations applicable to conventional ΣΔ ADC implementations may be adoptable by the NΣΔ ADC described above. These will be apparent to one skilled in the art and may all be applicable to invention. As example, the CT loop filter implementations may differ in filter order, architecture, structure, type, etc. As further examples the ΣΔ modulation part may be of different orders, etc.

The NΣΔ ADC may be implemented using single ended and/or differential signal paths (or combination thereof). The tradeoffs may depend on particular circumstances and will be apparent to one skilled in the art.

The center frequency of the input (311) signal to digitalize may be programmed by only changing the coefficients and/or phases in N-path down conversion part (310) while keeping the rest of the NΣΔ ADC static.

The bandwidth of the input (311) signal to digitalize may be programmed by changing some or all of the CT loop filter parameters (330a, 330b, . . . , 330n, 350).

The center frequency and/or bandwidth may be programmed by only changing the clock from which the phases may be derived in the N-path down conversion part (310) and/or the sampling clocks/frequency (362).

It will be apparent by one skilled in the art that the embodiment shown in FIG. 3 may include the embodiment shown in FIG. 2 given appropriate selection of parameters.

The embodiment shown in FIG. 3 includes additional circuitry that may be beneficial while implementing NΣΔ ADC in integrated circuit. While mathematically some transformations may be combined (e.g. multiple filters, scalers, etc.) it may be beneficial in actual realization to apply transformations in sequence and/or in distributed manner, etc.

The NΣΔ ADC described above with respect to FIG. 3 may include various optional components leading to alternative embodiments. For example, depending on the target characteristics, implementation details, process technology, etc. it may be beneficial to select an embodiment with particular architecture. Particular characteristics will determine which architecture and coefficients will better suit many conflicting parameters, so we leave that decision to the particular design. Arbitrary combinations of optional components listed hereafter and even other combinations are possible and part of the invention.

In a first example, the first feedback loops (322a, 322b, . . . , 322n) and thus also the first combiners (320a, 320b, . . . , 320n) are optional and any of them may not exist. The first feedback loops (322a 322b, . . . , 322n) may be removed by setting the scalers multiplication values to zero for each of the feedback loop to be removed. For example, if all first feedback loops are to be removed, all multiplication values may be set to zero ($p_1 \leftarrow 0$, $p_2 \leftarrow 0$, . . . , $p_N \leftarrow 0$). The output (e.g. 316a, 316b, . . . , 316n) of N-path down conversion part (310) may connect to the input of the relevant first filter (e.g. 330a, 330b, 330n) if the first combiner is removed.

In another example, the second feedback loop (348) is optional and may not exist. The second feedback loop may be removed by setting the scaling (348) to be multiplication by zero ($p_X \leftarrow 0$). In such a case, also the third combiner (346) may be removed by connecting output (345) directly to second filter (350).

It will be apparent to one skilled in the art that in some cases, it may be beneficial to have a feedback loop (e.g. through 322a, 322b, . . . , 322n) that encompasses more components (even at expense of extra complexity), while in other cases it may be beneficial to have simpler structure with only feedback loop (348), while yet in other cases, it may be beneficial to have multiple feedback loops. In usual embodiments, at least one of the feedback loops (322a, 322b, . . . , 322n, 348) remains.

In another example, the first filters (330a, 330b, . . . , 330n) are optional and may not exist. Any and all of the first filters (e.g. 330a, 330b, . . . , 330n) may be removed by connecting the output of the relevant first combiners (320a, 320b, . . . , 320n) directly to input of the relevant scalers (e.g. 340a, 340b, . . . , 340n) or selecting filter characteristic to be identity transformation in the band of interest.

In another example, the scalers (340a, 340b, . . . , 340n) are optional and may not exist. Any and all of the scalers (e.g. 340a, 340b, . . . , 340n) may be removed by connecting relevant output (e.g. 332a, 332b, . . . , 332n) directly to the combiner (344).

In another example, the functionality of the second combiner (344) and third combiner (346) may be merged into one combiner with more inputs or distributed into further additional combiners.

While FIG. 3 has been described in detail above, further details are provided below. As discussed above, FIG. 3 shows a block diagram of an embodiment of a N$\Sigma\Delta$ ADC implemented with one quantizer.

The N$\Sigma\Delta$ modulator may be built of N arrays of N mixers; each mixer may have two inputs: Vin and Ly, where y is the index of clock signal that drive corresponding mixer (y=1, 2, . . . , N). Clocks L1, L2, . . . , LN may be non-overlapping phases (clocks) with width of T/N while each of them may be delayed by $$T_{\Delta x} = x \frac{T}{N},$$

where x=0, 1, . . . , N−1. More details may be seen in FIG. 1C. Output of each mixer may thus be phase-shifted version of down-mixed input signal where the phase shifts may be dependent on phase-shifts of the clocks. The mixer may be implemented by a CMOS switch(es).

Each signal after the mixer may be multiplied with, e.g., real and/or complex weight kpq (p=1, 2, . . . , N, and q=1, 2, . . . , N), where index may p represent the group and index q may represent the index of the clock. Outputs of each group may be added together, and filtered with corresponding filters H1($\omega$), H2($\omega$), . . . , HN($\omega$). By changing the coefficients kpq, it may be possible to change or program the center frequency of the N-path part of the $\Sigma\Delta$ modulator, and attenuate out of band components. In addition, by appropriate selection of the coefficients, it may be possible to attenuate some blocker components. The center frequency $f_0$ of the resultant BP filter may be higher than sampling frequency $f_S$ (for example: N=8, $f_0 = nc^* f_S$, where nc=0, 1, . . . , N/2 or even nc>N/2) and thus may help in reducing the power consumption. Usually filters H1($\omega$) (330a), H2($\omega$) (330b), HN($\omega$) (330n) may filter out remains of high frequency (HF) components after the mixer, so each signal after mixing (LF1 (332a), LF2 (332b), . . . LFN (332n)) may contain base band signal (down-converted signal with corresponding phase) and remaining of HF components that may depend on the H1($\omega$) (330a), H2($\omega$) (330b), . . . , HN($\omega$) (330n) characteristics. The position of switches and coefficients may also be reversed, dependent on the implementation of the coefficients.

Usually the filters $H_1(\omega)$ (330a), $H_2(\omega)$ (330b), . . . , $H_N(\omega)$ (330n) may be built as simple first order passive RC or gm-c filters, however $H_1(\omega)$ (330a), $H_2(\omega)$ (330b), . . . , $H_N(\omega)$ (330n) may also be higher order passive or GM-C filter or some other filter to improve the attenuation of out of the band components, potentially at the expense of circuit area and power consumption. In such case the incoming signal with frequency around $f_0 = nc^* f_S$ may be down-converted to the DC and the bandwidth may be limited by the characteristics of $H_1(\omega)$ (330a), $H_2(\omega)$ (330b), . . . , $H_N(\omega)$ (330n). Eventual components in the folding bands may be attenuated by selecting appropriate coefficients kpq (p=1, 2, . . . , N, and q=1, 2, . . . , N). In optimized circuit it may be beneficial that as many coefficients kpq as possible are 0 to reduce silicon area and power consumption since coefficients are usually realized with trans-conductors that require power for their operation. Fortunately, in this arrangement the trans-conductors may operate at low frequency in the base-band. In addition, each coefficient different than zero may require full set of switches that may need to be driven with appropriate clocks, which again may consume a lot of power.

The LF signals $LF_1$ (332a), $LF_2$ (332b), . . . , $LF_N$ (332n) may be added together using different weights. At the same time, the signal coming from the low frequency part of a BP $\Sigma\Delta$ ($Y_{dac}$) may be subtracted using appropriate weights ($p_1$ (322a), $p_2$ (322b), . . . , $p_N$ (322n)). The resulting signals ($S_1$, $S_2$, . . . , $S_N$) may then be filtered using filters $H_1(\omega)$ (330a), $H_2(\omega)$ (330b), . . . , $H_N(\omega)$ (330n). Each of the $H_1(\omega)$ (330a), $H_2(\omega)$ (330b), . . . , $H_N(\omega)$ (330n) filters may realize a part of the loop filter of a $\Sigma\Delta$ modulator. Signal LFO (345) may enter the rest of the loop filter $H_X(\omega)$; usually this may be a LP or BP filter whose output signal Z0 (352) may be quantized with one-bit or multi-bit quantizer. The result may be one-bit or multi-bit digital signal that is composed of the down-converted base band signal and shaped quantization noise. When the $H_1(\omega)$ (330a), $H_2(\omega)$ (330b), . . . , $H_N(\omega)$ (330n) are LP filters, the rest of the modulator may be LP modulator, that may be followed by standard single-bit or multi-bit digital decimation filter and further digital signal processing at low frequency.

It is also possible in embodiments to implement filters $H_1(\omega)$ (330a), $H_2(\omega)$ (330b), . . . , $H_N(\omega)$ (330n) as a BP filters using SAW/BAW filters with fixed center frequency. This may be an interesting solution because filters implemented in this way may have very stable center frequency ($f_{SAW}$) and high-quality factor; however, with existing technologies, it may be difficult to integrate such filters on the same silicon substrate as the rest of the electronics. The center frequency of the incoming signal, which is down-converted or up-converted, is in this case equal to $f_0=nc^*f_s\pm f_{SAW}$ and can be changed by changing fs or/and nc. In that case the rest of the loop filtering may be changed correspondingly; The order of $H_X(\omega)$ may be reduced or completely removed, since SAW/BAW filters have very stable and steep characteristics. It is also possible, that filters $H_1(\omega)$ (330a), $H_2(\omega)$ (330b), . . . , $H_N(\omega)$ (330n) and $H_X(\omega)$ are joined together to continuous time filters $H(\omega)$ which are used on one hand as a loop filter of a $\Sigma\Delta$ modulators and on the other hand the filter to remove the remaining HF components of signals ($S_1, S_2, . . . , S_N$). after mixing (320a, 320b, . . . , 320n).

Figure 4A:
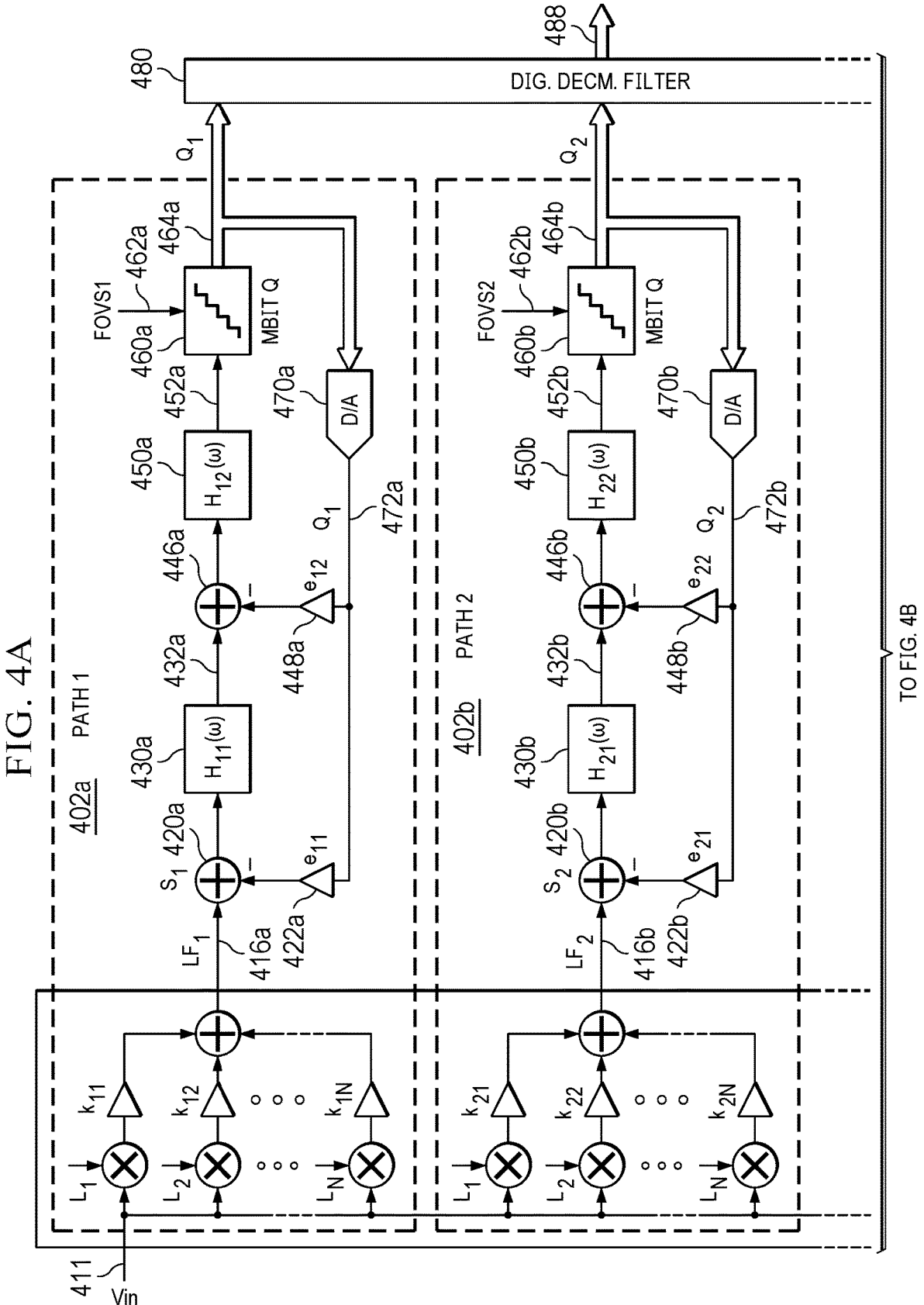
FIG. 4 (split in the figures as FIG. 4A and FIG. 4B) depicts embodiments of the NΣΔ ADC circuits with multiple quantizers.
Figure 4B:
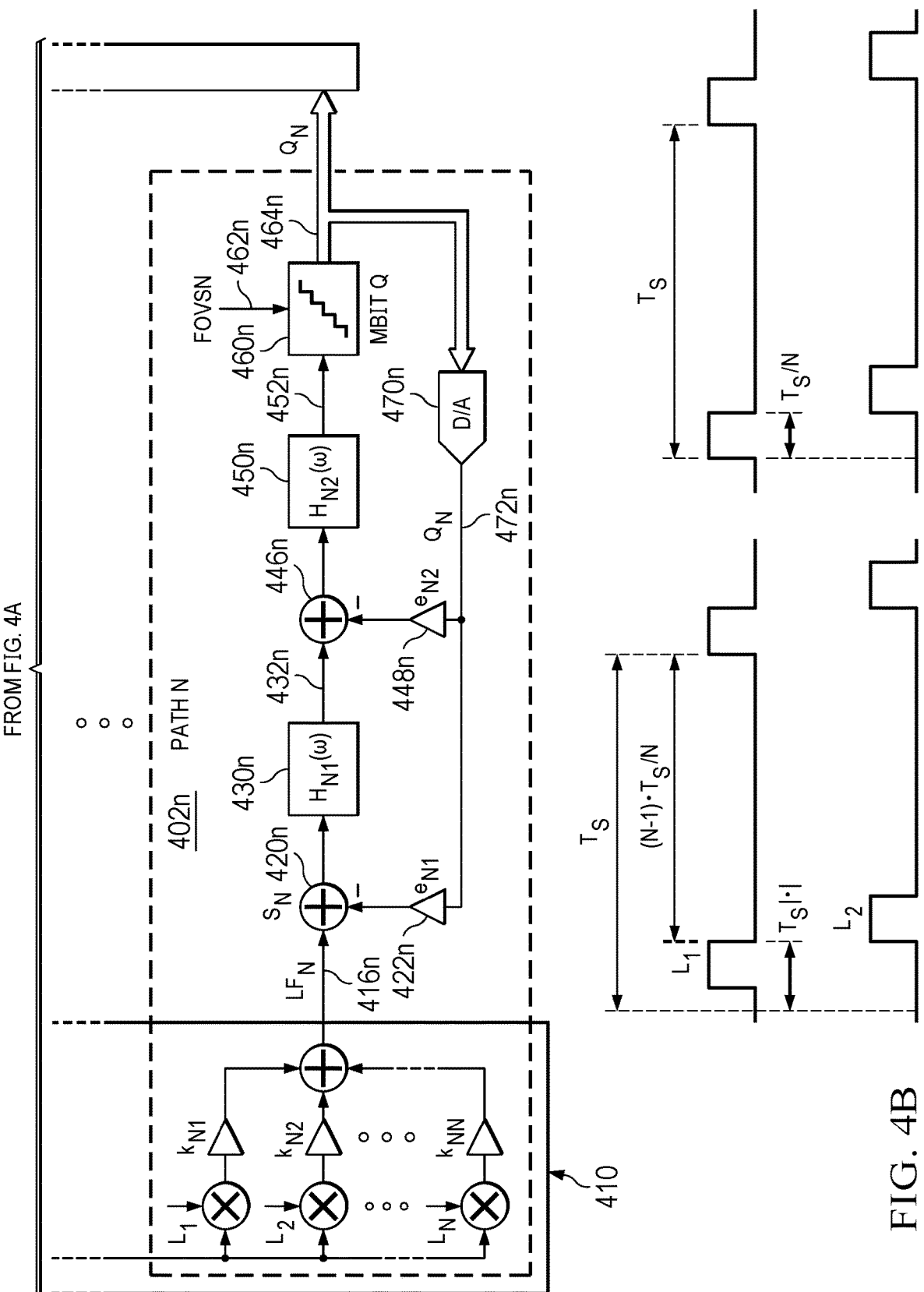

FIG. 4 depicts alternative embodiments of the $\Sigma\Delta$ ADC circuits with multiple quantizers. Alternative embodiments may provide additional flexibility when implementing the N$\Sigma\Delta$ ADC circuit, enabling a designer to better address conflicting design trade-offs and parameters. For example, the circuit routing and layout may be simpler, there may be an additional gain due to multiple parallel quantizers, the combining of the paths may be performed by digital logic, etc.

Shown in FIG. 4 is a high-level conceptual diagram of a multi quantizer N$\Sigma\Delta$ ADC. The multi quantizer N$\Sigma\Delta$ ADC of FIG. 4 comprises the following items:

Usually HF analog input (411) is where the signal enters the N$\Sigma\Delta$ ADC. The input (411) signal may be in an arbitrary frequency band and may be either differential or single ended. The difference in structure of the circuitry between these two cases (FIG. 3/4) will be apparent to one skilled in the art.

The N-path down conversion part (410) with input (411) and single or multiple outputs (416a, 416b, . . . , 416n). The N-path down conversion part (410) comprises of signal shaping that may or may not be distinct for each path (402a, 402b, . . . , 402n).

The output (416a) on path 1 (402a) of the N-path down conversion part (410) may be an input into first combiner (or summation) circuit (420a). An additional input (422a) into first combiner (420a) may be scaled (multiplied by arbitrary value) output (472a) of the D/A converter (470a).

The output of the first combiner (420a) may be an input into filter (430a). The filter (430a) may have low pass, band pass or arbitrary other characteristic and may be of an arbitrary order. The signal of interest in the output (432a) of the filter (430a) may be at lower or otherwise more beneficial frequency band comparing to the signal of interest on the input (411) to the N$\Sigma\Delta$ ADC.

The output (432a) of the filter (430a) may be scaled (multiplied by arbitrary value) for scaling the signal levels in the band of interest as part of the filtering characteristics of filter (430a).

The second combiner (446a) with input (432a) and negated feedback input (448a) that may be scaled (multiplied by arbitrary value) value of the D/A converter (470a) output (472a).

The second filter (450a) that may have low pass, band pass or arbitrary other characteristic with input (452a) that is connected to the output of second combiner (446a) and output that is connected to one or multi-bit quantizer (460a). The filter (450a) may have low pass, band pass or arbitrary other characteristic and may be of an arbitrary order.

The one or multi-bit quantizer (460a) with usually analog input (452a) and usually digital output (464a). The sampling clock (462a) may or may not be programmable.

Digital decimation filter (480) with usually digital inputs (464a, 464b, . . . , 464n) and usually digital output (488). The signals on distinct digital inputs (464a, 464b, . . . , 464n) may be combined in the digital decimation filter (480) or subsequent digital processing logic.

D/A converter (470a) with digital input (464a) generating analog output (472a) which is connected to one or multiple feedback loops (448a, 422a).

The paths 2, . . . , N, (402b, . . . , 402n) may be structurally equivalent to path 1 (402a). The components in distinct paths may have distinct characteristics.

The $\Sigma\Delta$ ADC depicted in FIG. 4 operates as follows. The input (411) of the N$\Sigma\Delta$ ADC may have an arbitrary frequency translation characteristic and/or may have additional signal transformation characteristics, harmonic rejection, spectral shaping, fold-back reduction, etc. applied to it (411) by the N-path down conversion part (410). These transformations may be determined such to optimize the overall signal transfer function from N$\Sigma\Delta$ ADC input (411) to N$\Sigma\Delta$ ADC output (488) and e.g. suppress undesirable spectrum components, attenuate folding, reject out-of-band signals, etc.

The first combiners (420a, 420b, . . . , 420n) may enable positive or usually negative feedback loop combining each of the outputs (416a, 416b, . . . , 416n) with possibly distinct and arbitrarily scaled values (422a, 422b, . . . , 422n) of the outputs (472a, 472b, . . . , 472n) of the D/A converters (470a, 470b, . . . , 470n). Following the first combiners (420a, 420b, . . . , 420n) the signals propagating from the outputs of the first combiners (420a, 420b, . . . , 420n) may be filtered by possibly distinct first filters (430a, 430b, . . . , 430n). The filter characteristics may or may not differ between (430a, 430b, . . . , 430n) and may have low pass, band pass or arbitrary characteristic. The architecture of the filters may be arbitrary and include arbitrary order filters, passive or active filters, etc. The outputs (432a, 432b, . . . , 432n) of the first filters (430a, 430b, . . . , 430n) may be further distinctly scaled (multiplied by arbitrary values) due to specific signal transfer function of the first filters (430a, 430b, . . . , 430n) and signal levels in the band of interest.

The second combiner (446a, 446b, . . . , 446n) may sum (combine) the first feedback signal (448a, 448b, . . . , 448n) with the output (432a, 432b, . . . , 432n) of the filters (432a, 432b, . . . , 432n). The second feedback signals (448a, 448b, . . . , 448n) may be scaled (multiplied by arbitrary value) signals present on the outputs (472a, 472b, . . . , 472n) of the D/A converters (470a, 470b, . . . , 470n).

The second filters (450a, 450b, . . . , 450n) may apply an arbitrary signal transform function to the outputs of the second combiners (446a, 446b, . . . , 446n) to generate outputs (452a, 452b, . . . , 452n). Examples of the signal transfer function may have low pass, band pass or other characteristics and may be of the arbitrary order. The first filters (430a, 430b, . . . , 430n) and second filters (450a, 450b, . . . , 450n) may perform the function of the (CT) loop filter. The transfer functions of the first filters (430a, 430b, . . . , 430n) and second filters (450a, 450b, . . . , 450n) may be chosen such that it suppresses unwanted spectral components and/or boosts the signal of interest on the output (488) of the NΣΔ ADC.

The one or multi-bit quantizers (460a, 460b, . . . , 460n) may sample an analog signal on inputs (452a, 452b, . . . , 452n) with sampling frequency/clock (462a, 462b, . . . , 462n) to produce a one or multi bit digital outputs (464a, 464b, . . . , 464n). The outputs (464a, 464b, . . . , 464n) of the one or multi bit quantizers (460a, 460b, . . . , 460n) may be inputs (464a, 464b, . . . , 464n) into D/A converters (470a, 470b, . . . , 470n). The D/A converters (470a, 470b, . . . , 470n) may be used to generate the usually negative feedback loop signals (472a, 472b, . . . , 472n) that may be further scaled (448a, 448b, . . . , 448n, 422a, 422b, . . . , 422n).

The outputs (464a, 464b, . . . , 464n) may also be inputs into digital decimation filter (480) that may perform arbitrary digital filtering or digital processing to produce an output (488) of the NΣΔ ADC.

Note that the advantages discussed with respect to the architecture of FIGS. 2 and 3 apply also to embodiments detailed in FIG. 4. Also, as before, all signal paths on the diagram are showed as single ended. However other configurations are possible with arbitrary mix of single ended and differential signal paths as may be convenient for particular design, in particular technology and with particular specifications. The realization differences and trade-offs between single ended and differential signal paths will be apparent to one skilled in the art.

Many variations, optimizations and alternative implementations applicable to conventional ΣΔ ADC implementations may be adoptable by the NΣΔ ADC. These will be apparent to one skilled in the art and may all be applicable to invention. As example, the CT loop filter implementations may differ in filter order, architecture, structure, type, etc. As further examples the ΣΔ modulation part may be of different orders, etc.

The NΣΔ ADC may be implemented using single ended and/or differential signal paths (or combination thereof). The tradeoffs may depend on particular circumstances and will be apparent to one skilled in the art.

The center frequency of the input (411) signal to digitalize may be programmed by only changing the coefficients and/or phases in N-path down conversion part (410) while keeping the rest of the NΣΔ ADC static.

The bandwidth of the input (411) signal to digitalize may be programmed by changing some or all of the CT loop filter parameters (430a, 430b, . . . , 430n, 450a, 450b, . . . , 450n).

The center frequency and/or bandwidth may be programmed by only changing the clock from which the phases may be derived in the N-path down conversion part (410) and/or the sampling clocks/frequency (462a, 462b, . . . , 462n).

The embodiment shown in FIG. 4 includes additional circuitry that may be beneficial while implementing NΣΔ ADC in integrated circuit. While mathematically some transformations may be combined (e.g. multiple filters, scalers, . . . ) it may be beneficial in actual realization to apply transformations in sequence and/or in distributed manner, etc.

Various optional components may be used in the described NΣΔ ADC, leading to alternative embodiments. Examples of variations resulting in alterative embodiments include:

Depending on the target characteristics, implementation details, process technology, etc. it may be beneficial to select an embodiment with particular architecture. Particular characteristics will determine which architecture and coefficients will better suit many conflicting parameters, so we leave that decision to the particular design. Arbitrary combinations of optional components listed hereafter and even other combinations are possible and part of the invention.

The first feedback loops (422a, 422b, . . . , 422n) and thus also the first combiners (420a, 420b, . . . , 420n) are optional and any of them may not exist. The first feedback loops (422a 422b, . . . , 422n) may be removed by setting the scalers multiplication values to zero for each of the feedback loop to be removed. In one example, if all first feedback loops are to be removed, all multiplication values may be set to zero ($e_{11} \leftarrow 0$, $e_{21} \leftarrow 0$, . . . , $e_{N1} \leftarrow 0$). The outputs (e.g. 416a, 416b, . . . , 416n) of N-path down conversion part (410) may connect to the input of the relevant first filters (e.g. 430a, 430b, . . . , 430n) if the first combiners are removed.

The second feedback loops (448a, 448b, . . . , 448n) are optional and may not exist. They may be removed by setting the scaling (448a, 448b, . . . , 448n) to be multiplication by zero ($e_{12} \leftarrow 0$, $e_{22} \leftarrow 0$, . . . , $e_{N2} \leftarrow 0$). In such case, the second combiners (446a, 446b, . . . , 446n) may be removed by connecting outputs (432a, 432b, . . . , 432n) directly to second filters (450a, 450b, . . . , 452n).

It will be clear to one skilled in the art that in some cases, it may be beneficial to have feedback loops (e.g. through 422a, 422b, . . . , 422n) that encompass more components (even at the expense of extra complexity), while in other cases, it may be beneficial to have a simpler structure with only feedback loops (448a, 448b, . . . , 448n), while yet in other cases, it may be beneficial to have multiple feedback loops. In usual embodiments, at least one of the feedback loops (422a, 422b, . . . , 422n, 448a, 448b, . . . , 448n) remains.

The first filters (430a, 430b, . . . , 430n) are optional and may not exist. Any or all of the first filters (e.g. 430a, 430b, . . . , 430n) may be removed by connecting the output of the relevant first combiners (420a, 420b, . . . , 420n) directly to input of the second combiners (e.g. 446a, 446b, . . . , 446n) or selecting filter characteristic to be identity transformation in the band of interest.

FIG. 4 shows the first part of the circuit, which may include N arrays of input mixers with their outputs added together using different weights $k_{pq}$ and which may be the same as before (e.g., see FIG. 3). From here on, the architecture may be different compared to FIG. 3. Signals $S_1$, $S_2$, $S_N$ may be formed by subtracting the weighted signals $Q_1$ (472a), $Q_2$ (472b), . . . , $Q_N$ (472n) from signals $LF_1$ (416a), $LF_2$ (416b), . . . , $LF_N$ (416n). These differences may be put through corresponding loop filters and quantized with one or multi-bit quantizers. Signals subtracting the weighted signals $Q_1$ (472a), $Q_2$ (472b), . . . , $Q_N$ (472n) may be generated by converting digital output signals from the quantizers of the corresponding channel to analog domain. The easiest possibility may be to use one-bit quantizers and DA converters, since, in this case the circuits may be very simple, may not require a big silicon area and may have low power consumption dependent on the oversampling clock frequency, at the expense of more complicated decimation filters and possibly higher order loop filters $H_{11}(\omega)$ (430a), $H_{21}(\omega)$ (430b), . . . , $H_{N1}(\omega)$ (430n) and $H_{12}(\omega)$ (450a), $H_{22}(\omega)$ (450b), . . . , $H_{N2}(\omega)$ (450n). The order of the filters $H_{11}(\omega)$ (430a), $H_{21}(\omega)$ (430b), . . . , $H_{N1}(\omega)$ (430n) and $H_{12}(\omega)$ (450a), $H_{22}(\omega)$ (450b), . . . , $H_{N2}(\omega)$ (450n) may be determined from the required SnR of the AD converted signal and amount of attenuation needed for high order products of N-path downconverter part. As before, $H_{11}(\omega)$ (430a), $H_{21}(\omega)$ (430b), . . . , $H_{N1}(\omega)$ (430n) and $H_{12}(\omega)$ (450a), $H_{22}(\omega)$ (450b), . . . , $H_{N2}(\omega)$ (450n) may form a loop filter with their order determining the order of the $\Sigma\Delta$ modulator and thus the noise shaping characteristics.

In the case of a one-bit quantizer and DA converter, the jitter characteristics may influence the SnR to large extent, therefore in that case very good (low jitter) clock charac-teristics may be required. For multi-bit DA the jitter influ-ence may be reduced, however, matching properties of the DA elements must be handled correctly.

The sampling frequency of the quantizers and DA con-verters may depend on the required bandwidth SnR and out-of-band attenuation. The most natural selection may be to have the frequency of the sampling signals of each path equal to the frequency of Lx, where x=1, 2, . . . , N; therefore L1 for the first path, L2 for the second, etc., and LN for the last. With appropriate clocking scheme and the coefficients, the conversion time may be as long as $$T_{conv} < \frac{(N-1)T}{N}$$

and that may reduce the power consumption further. How-ever, to achieve better SnR the DA converters may be clocked at other, higher frequencies.

In both embodiments (FIG. 3 and FIG. 4), filters may be implemented using programmable continuous-time passive components implementation, that is, RC or Gm-C. The $\Sigma\Delta$ loop may need some gain, which may be required to sufficiently attenuate in-band quantization noise.

Figure 5A:
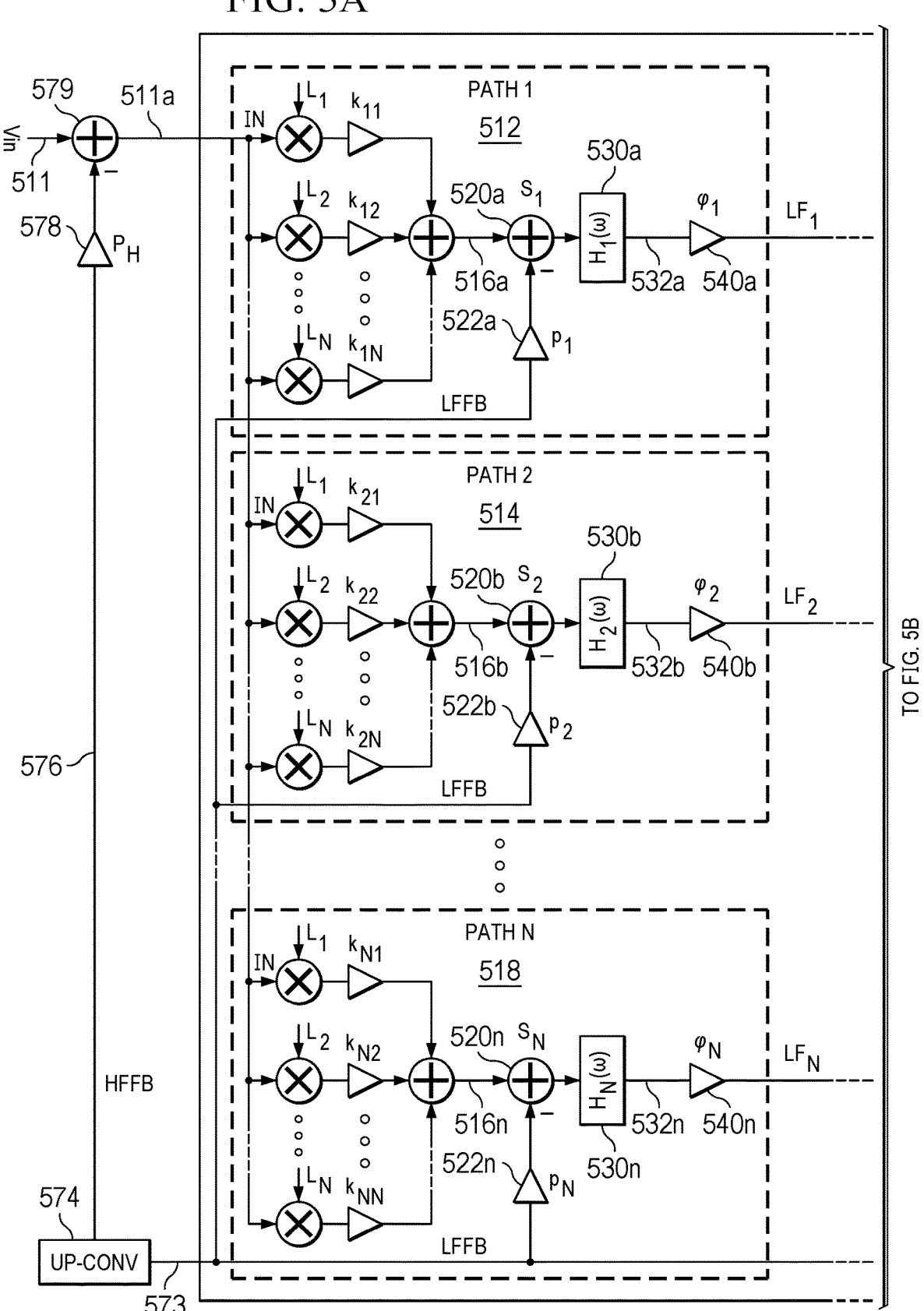
FIG. 5 (split in the figures as FIG. 5A and FIG. 5B) depicts a block diagram of an NΣΔ ADC with one quantizer and an additional up-converted HF feedback signal.
Figure 5B:
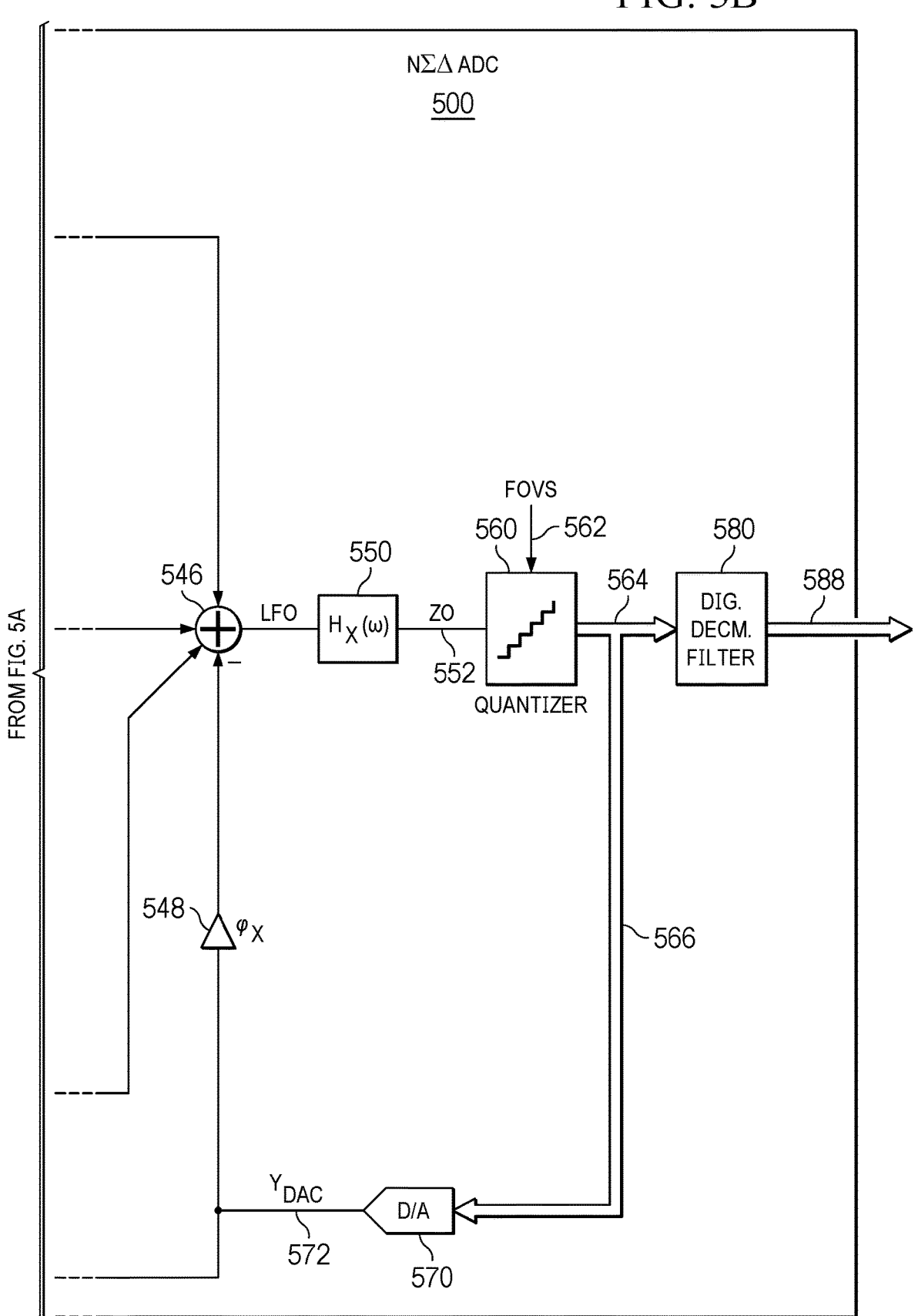

FIG. 5 shows a block diagram of an embodiment of an N$\Sigma\Delta$ ADC with one quantizer and an additional up-con-verted HF feedback signal. The difference between embodi-ments of FIG. 3 and FIG. 5 may be a HF feedback (578), implemented with up-conversion mixer (574) that may up-convert the low frequency $Y_{DAC}$ signal (572), which may be subtracted (579) from the signal $V_{in}$ (511) at high fre-quency. The benefit of such HF feedback path may be that all elements of the circuit are in a feedback, which can provide better characteristics.

Shown in FIG. 5 is a high-level conceptual diagram of a N$\Sigma\Delta$ ADC with one quantizer and an additional up-con-verted high frequency feedback comprising:

The N$\Sigma\Delta$ ADC without an additional high frequency feedback (500), which may be as previously disclosed (FIG. 3: 300), and with additional output (573) from the D/A converter (570).

The upconverter (574) with input (573) and output (576).

The feedback loop with scaler (578) that may scale (multiply by an arbitrary number) the input signal (576) and provide an input into HF combiner (579).

Usually HF analog input (511), where the signal enters the N$\Sigma\Delta$ ADC with one quantizer and an additional HF feedback loop. The input (511) signal may be in arbi-trary frequency band and may be either differential or single ended. The differences in structure of the cir-cuitry between this and other embodiments will be apparent to one skilled in the art.

The HF combiner (579) that may combine (add) the input (511) and the input from the HF feedback loop (578). The output of the HF combiner (579) may be an input into the N$\Sigma\Delta$ ADC with single quantizer and without HF feedback (500).

The output (588) of the N$\Sigma\Delta$ ADC.

The $\Sigma\Delta$ ADC depicted in FIG. 5 operates as follows. The input (511) of the N$\Sigma\Delta$ ADC with one quantizer and HF feedback loop may be combined (added) with the HF feedback signal (578). The output (572) of the D/A converter (570) may be an input into up-converter (574), where it may be upconverted in frequency or where other frequency translation may be performed. The output (576) of the upconverter (574) may be scaled (multiplied by arbitrary value) by the scaler (578) and may be an input into combiner (579). The output (511a) of the combiner (579) may be an input into N$\Sigma\Delta$ ADC with one quantizer and without HF feedback (500) that may operate as previously disclosed (FIG. 3: 300).

Note that, as it will be clear to one skilled in the art, the combiner (546) may perform the same functions as com-biners (FIG. 3: 344) and (FIG. 3: 346). Also, the up-converter (574) is optional and may be missing. In such case the input (573) into up-converter may connect directly to the scaler (578). The D/A converter (570) may operate at high frequencies and the output (572) may contain high fre-quency signals. The D/A converter (570) output (572) may be filtered.

Figure 6A:
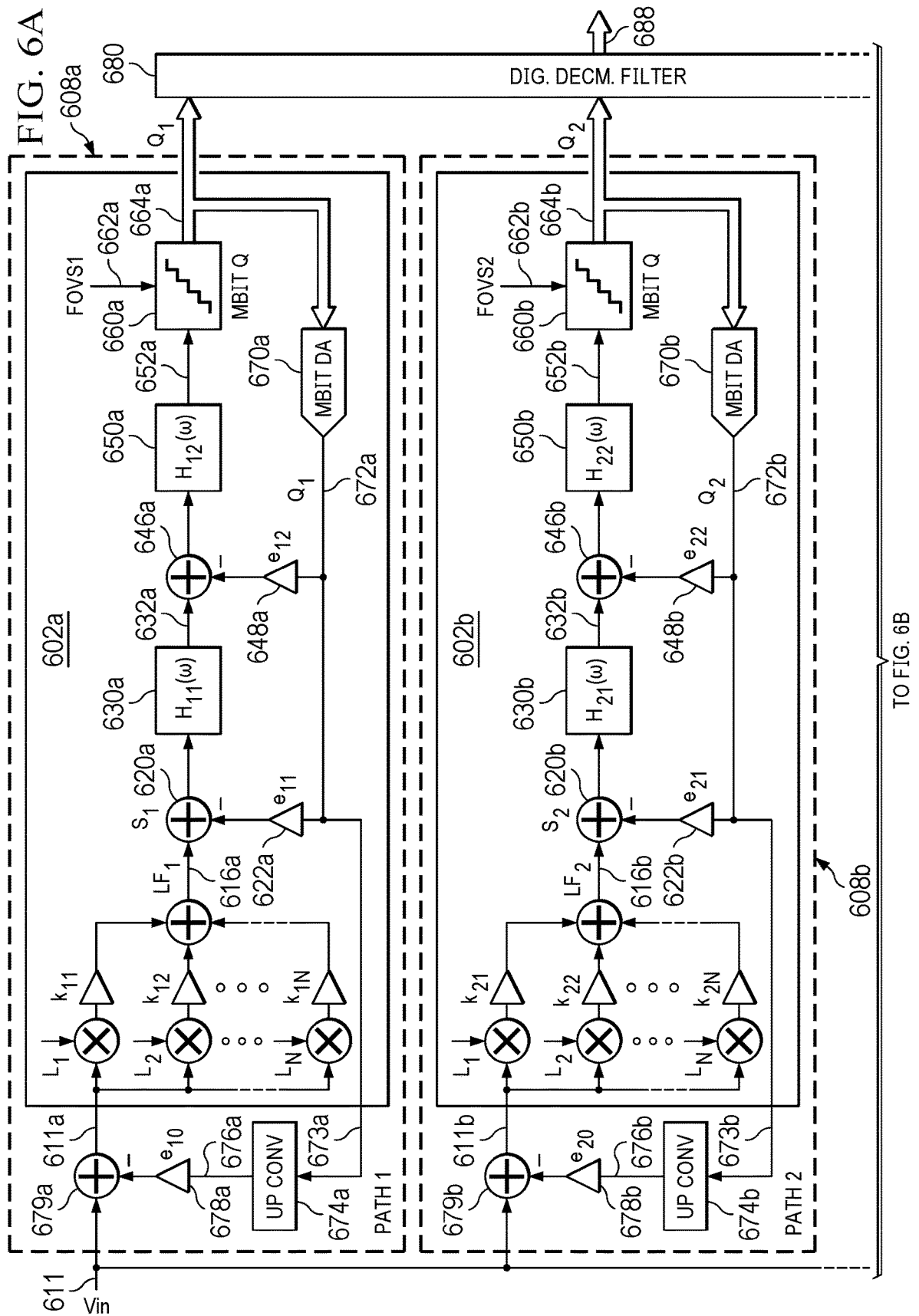
FIG. 6 (split in the figures as FIG. 6A and FIG. 6B) depicts a block diagram of an NΣΔ ADC with an array of quantizers and additional up-converted HF feedbacks.
Figure 6B:
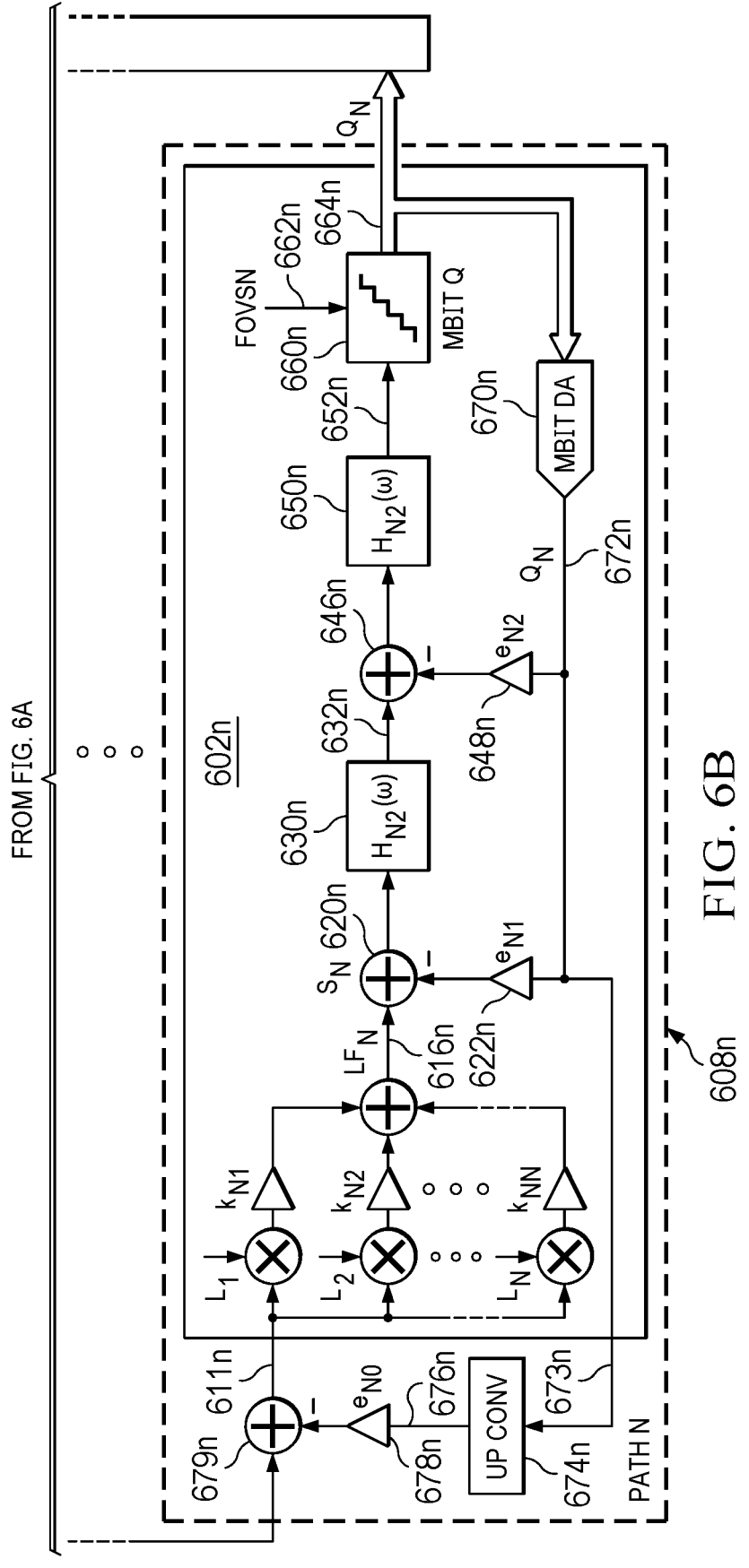

FIG. 6 shows a block diagram of an embodiment of an N$\Sigma\Delta$ ADC with an array of quantizers and additional up-converted HF feedbacks. The difference between embodi-ments of FIG. 4 and FIG. 6 include a HF feedback (678a, 678b, . . . , 678n) in each path (608a, 608b, . . . , 608n), implemented with up-conversion mixers (674a, 674b, . . . , 674n) that may up-convert the signal low frequency signals (673a, 673b, . . . , 673n), which may be subtracted in combiners (679a, 679b, . . . , 679n) from the input signal (611) at high frequency. The benefit of such HF feedback paths is that all elements of the circuit may be in a feedback, which may provide better characteristics.

Shown in FIG. 6 is a high-level conceptual diagram of N$\Sigma\Delta$ ADC with an array of quantizers and additional up-converted high frequency feedbacks comprising:

Usually HF analog input (611) where the signal enters the N$\Sigma\Delta$ ADC with an array of quantizers and additional up-converted HF feedback loops. The input (611) sig-nal may be in arbitrary frequency band and may be either differential or single ended. The difference in structure of the circuitry between this and other embodiments will be apparent to one skilled in the art.

Circuit blocks (602a, 602b, . . . , 602n), which may be as previously described paths (e.g., FIG. 4: 402a, 402b, . . . , 402n) with additional outputs (673a, 673b, . . . , 673n) from the one or more bit digital to analog (D/A) converters (670a, and corresponding ones in other paths).

The up-converters (674a, 674b, . . . , 674n) with inputs (673a, 673b, . . . , 673n) and outputs (676a, 676b, . . . , 676n).

The feedback loops with scalers (678a, 678b, . . . , 678n) that may scale (multiply by arbitrary number) the input signals (676a, 676b, . . . , 676n) and provide inputs into HF combiners (679a, 679b, . . . , 679n)

The HF combiners (679a, 679b, . . . , 679n) that may combine (add) the input (611) and the input from the HF feedback loop outputs (678a, 678b, . . . , 678n). The outputs of the HF combiners ($679a$, $679b$, . . . , $679n$) may be inputs into the circuit blocks ($602a$, $602b$, . . . , $602n$).

The decimation filter ($680$) with inputs ($664a$, $664b$, . . . , $664n$) connected to the outputs ($664a$, $664b$, . . . , $664n$) of the circuit blocks ($602a$, $602b$, . . . , $602n$).

The $\Sigma\Delta$ ADC depicted in FIG. $6$ operates as follows. The input ($611$) of the N$\Sigma\Delta$ ADC with an array of quantizers and additional up-converted high frequency feedbacks may be combined (added) with the HF feedback signals ($678a$, $678b$, . . . , $678n$). The outputs ($672a$, and corresponding ones in other paths) of the D/A converters ($670a$, and corresponding ones in other paths) may be inputs into up-converters ($674a$, $674b$, . . . , $674n$) where the signals may be upconverted in frequency or where other frequency translations may be performed.

The outputs ($676a$, $676b$, . . . , $676n$) of the upconverters ($674a$, $674b$, . . . , $674n$) may be scaled (multiplied by arbitrary value) by the scalers ($678a$, $678b$, . . . , $678n$) and may be inputs into combiners ($679a$, $679b$, . . . , $679n$). The outputs ($611a$, $611b$, . . . , $611n$) of the combiners ($679a$, $679b$, . . . , $679n$) may be inputs into circuit blocks ($602a$, $602b$, . . . , $602n$) that may operate as previously disclosed paths (FIG. $4$: $402a$, $402b$, . . . , $402n$). The outputs ($664a$, $664b$, . . . , $664n$) of the circuit blocks ($602a$, $602b$, . . . , $602n$) may be inputs into digital decimation filter ($680$). The digital decimation filter may perform digital signal processing to filter out unwanted signal components.

Note that the up-converters ($674a$, $674b$, . . . , $674n$) are optional and may be missing. In such case the inputs ($673a$, $673b$, . . . , $673n$) into up-converters may connect directly to the scalers ($678a$, $678b$, . . . , $678n$). The D/A converters ($670a$, and corresponding ones in other paths) may operate at high frequencies and the outputs ($672a$, $672b$, . . . , $672n$) may contain high frequency signals. The D/A converter ($670a$, $670b$, . . . , $670n$) outputs ($672a$, $672b$, . . . , $672n$) may be filtered.

Also note that some parts of disclosed circuits may be naturally digital however may require customer and/or analog implementation to reach required clock frequency. Thus, some signals may be digital while still requiring analog and/or custom implementation. An example may be first some stages of the digital decimation filters (due to frequency, power consumption, . . . ), etc.

Also note that signal paths on the diagrams are shown as single ended. However, other configurations are possible with an arbitrary mix of single ended and differential signal paths as may be convenient for particular design, in particular technology and with particular specifications. The realization differences and trade-offs between single ended and differential signal paths will be apparent to one skilled in the art.

Also note that all architectures of the embodiments disclosed herein may utilize digital decimation filters. The decimation filters may be slightly different. For example, the decimation filters in FIGS. $3$ and $5$ may utilize traditional LP or BP decimation filters based on the filter type of the modulator. The embodiments depicted in FIGS. $4$ and $6$, for example, may utilize a different decimation filter, because the task in this case may be to add bit-streams, perform attenuation of out-of-band quantization noise components, and reduce the sampling rate.

Some improvements for all embodiments, compared to the prior art, include at least the following:

it may be possible to change the center frequency either by programming the coefficients $k_{i,j}$, or by sampling frequency input filtering may be avoided or reduced $f_0$ may be higher than fs by utilizing the under-sampling effect; this may provide the opportunity to reduce the power consumption folding components may be attenuated by selecting the appropriate coefficients trans-conductors may operate in the base-band (BB). This may result in reduced power consumption instead of trans-conductors the resistors may be used the rest of the loop filter of the $\Sigma\Delta$ modulator may operate at BB, that may result in lower power consumption Internal Quantizer and DA converter may both operate at BB, that again may contribute to low power consumption The main loop amplification that may be implemented by a loop filter may be operating at BB, thus lower power consumption is possible compared to prior art implementations.

In addition, some specific advantages and improvements of embodiments of each particular architecture are listed below.

For example, advantages of embodiments utilizing a single quantizer (e.g., see FIGS. $3$ and $5$):

Using the first part of the N-path Spectrum Shaping filter variant instead of non Spectrum Shaping N-path filter as the part of the loop filter for the $\Sigma\Delta$ modulator makes possible to program the center frequency and provide attenuation of eventual folding components. Input signal may be down-converted with mixers driven with different phases ($L_1$ to $L_N$). Each of phase shifted LF signal may be then multiplied with different weights $k_{i,j}$. Those signals may be filtered using low order LP, BP or HP filters (they can be built in different ways like RC, Gm-C, SAW, BAW). The N-path up-conversion part switches (as in FIG. 1B: $150b$) following the filters $H_1(\omega)$, $H_2(\omega)$, . . . , $H_N(\omega)$ filters may need not be used here, so we may deal with BB signals at the output of the filters.

The LF signals from the outputs may be summed with appropriate weights to achieve desired characteristics of a loop filter. Based on the requirements, additional LF integrators may be added to implement appropriate loop-filter with increased order to improve noise shaping characteristics.

The signal at the output of the loop filter is quantized using single-bit or multi-bit internal quantizer sampled with appropriate synchronized oversampling clock (the frequency can be equal or lower than the sampling frequency of a N-path filter because of LF signal in this node) and thus power consumption may be reduced.

Quantized outputs represent digitized BB signal, which may contain down-converted incoming signal and shaped quantization noise. As with usual $\Sigma\Delta$ modulator, digital decimation filter may remove out of band quantization noise and may perform other signal processing tasks.

On the way back, the LF BB digital signal may be converted to analog signal using single-or multi-bit DAC as in standard $\Sigma\Delta$ modulator.

The feedback of architectures of FIGS. $4$ and $6$ can be composed of 2 parts: the first part may be LF feedback, where LF analog signal from the DAC may be fed back to the LF part of the loop filter with appropriate weights to assure stability of the loop and achieve appropriate noise shaping characteristics. The second, outer feedback signal may be generated by up-converting LF signal using switches of the right part of N-path filter structure, with appropriate weights. This HF signal may be subtracted from the HF signal at input mixers. In this way, the HF loop may be closed. This HF feedback path can be used or not dependent on the application.

Usually the filters $H_1(\omega)$, $H_2(\omega)$, . . . , $H_N(\omega)$ on FIG. 3 may be simple RC or Gm-C first or higher order LP filters. In that case using N-path down conversion structure, the center frequency may be adjusted by appropriate coefficients to any frequency $n^*f_S$, where $f_S$ may be a sampling frequency and n=0,1,2, . . . N/2 or even n>N/2, where N may be the order of a corresponding N-path filter. It may also be possible to use SAW or BAW BP filter; in that case the center frequency of a modulator may be changed from $n^*f_S$ to $nc^*f_S s \pm f_{SAW}$ where $f_{SAW}$ is center frequency of a SAW filter.

Advantages of embodiments utilizing multiple quantizers (e.g., see block FIGS. 4 and 6):

Using the first part of the N-path Spectrum Shaping filter variant instead of non Spectrum Shaping N-path filter as the part of the loop filter for the ΣΔ modulator makes possible to program the center frequency and provide attenuation of eventual folding components. Input signal may be down-converted with mixers driven with different phases ($L_1$ to $L_N$). Each of phase shifted LF signal may be then multiplied with different weights $k_{i,j}$. Those signals may be filtered using low order LP, BP or HP filters (they can be built in different ways like RC, Gm-C, SAW, BAW). The N-path up-conversion part switches (as in FIG. 1B: 150*b*) following the filters $H_1(\omega)$, $H_2(\omega)$, . . . , $H_N(\omega)$ filters may need not be used here, so we may deal with BB signals at the output of the filters.

The LF signals from the outputs may be summed with appropriate weights to achieve desired characteristics of a loop filter. Based on the requirements, additional LF integrators may be added to implement appropriate loop-filter with increased order to improve noise shaping characteristics.

Additional LF integrators may be added to each path to improve the noise shaping characteristics. After this operation, we have N low frequency signals with different phases.

Signals at the output of each filter may be quantized using one or multi bit internal quantizer (sampled with appropriate synchronized oversampling rate with frequency that is lower compared with the sampling frequency of a usual N-path filter, so the power consumption could be reduced).

Each quantized output may represent digitized base-band signal, which may contain down-converted incoming signal with corresponding phase, and shaped quantization noise. As with usual SD modulator, digital decimation filter may remove out of band quantization noise. The difference here may be that a new decimation filter that is capable of adding N bit-streams and provide attenuation of shaped quantization noise may be needed.

On the way back, each base-band digital one or multi bit signal may be converted to analog domain using single bit DAC as in standard one or multi bit LP or BP SD modulator but at relatively LF to reduce the power.

The feedback may be then composed of two parts: The first may be LF feedback, where LF analog signal from the DAC is fed back to the LF part of the loop filter with appropriate weights to assure stability of the loop and appropriate noise shaping characteristics. The second, outer feedback signal may be at HF and may be obtained by up converting each bit-stream.

One innovation of embodiments may be the use of an N-path filter inside sigma-delta loop as a part of loop filter and thus provide very accurate filtering with narrow bandwidth compared to the sampling frequency; the stability of a center frequency may not be dependent of the PVT variations because of the known properties of the N-path architectures. In usual N-path filtering operation, the LF signal is followed by up-mixing circuitry. However, innovation of some embodiments may include that the first part of the N-path Spectrum Shaping or other architecture of N-path filter (down conversion part and LP filter) may be used as in usual N-path Spectrum Shaping or other architecture of N-path filter while the second part may operate differently and after the quantizer in digital domain. This LF filtered signals may be summed with appropriate weights and then quantized using LF single or multi-bit quantizer to get digital output of the Sigma-Delta loop, that may be used as a digital representation of down-converted signal and may be further processed using appropriate DSP algorithm, removing shaped quantization noise and perform further DSP operation.

Sigma-Delta loop may be closed in the embodiments. A digital signal from the quantizer may be converted to the multi-bit analog signal using appropriate DA converter that may operate at relatively low frequency, and then this analog signal may be mixed up to generate HF signal, which may be then subtracted from the incoming signal at HF, possibly in a passive way. The block diagrams for embodiments are presented in FIGS. 5 and 6 (Extension with HF feedback).

Embodiments of the invention may use N-path Spectrum Shaping filter variant instead of non Spectrum Shaping N-path filter and break traditional N-path filter structure into multiple parts and use each of them separately: e.g. in the forward path and the other one in the feedback path. This arrangement makes possible to perform filtering and quantization at relatively low frequency. In this way, it is possible to significantly reduce power consumption and makes the operation stable.

Embodiments may use improved N-path structure inside Sigma delta loop, which provides the opportunity to reduce power consumption, makes possible to shape the spectrum and eliminate or attenuate fold-back components.

Other variants of the described embodiments include:

Filters $H(\omega)$ may be band-pass filter (implemented discretely or as a part of integrated circuit).

Filters $H(\omega)$ may be band-pass SAW filters: SAW filters with single BP frequency are possible to implement even in CMOS compatible processes (possibly with post processing step), since the thickness of piezo-electric material determines the frequency response.

Filters $H(\omega)$ may be band-pass (e.g. FinBAR) filters with different center frequencies and even pass band width:

Idea being that center frequencies that are different and not multiple of each other, introduce kind of dithering effect (eliminate or reduce spurs)

If FinBAR/FinBAW filters are used, it is possible to have filters with different pass band frequencies on the same wafer.

This variant is independent of others, as the different filtering structures may be implemented independently of the "Sigma Delta in the loop".

Filters $H(\omega)$ is a band-pass filter/resonator that is possible to be tuned in certain range and is integrated on top of the Silicon ASIC using appropriate technology.

Figure 7:
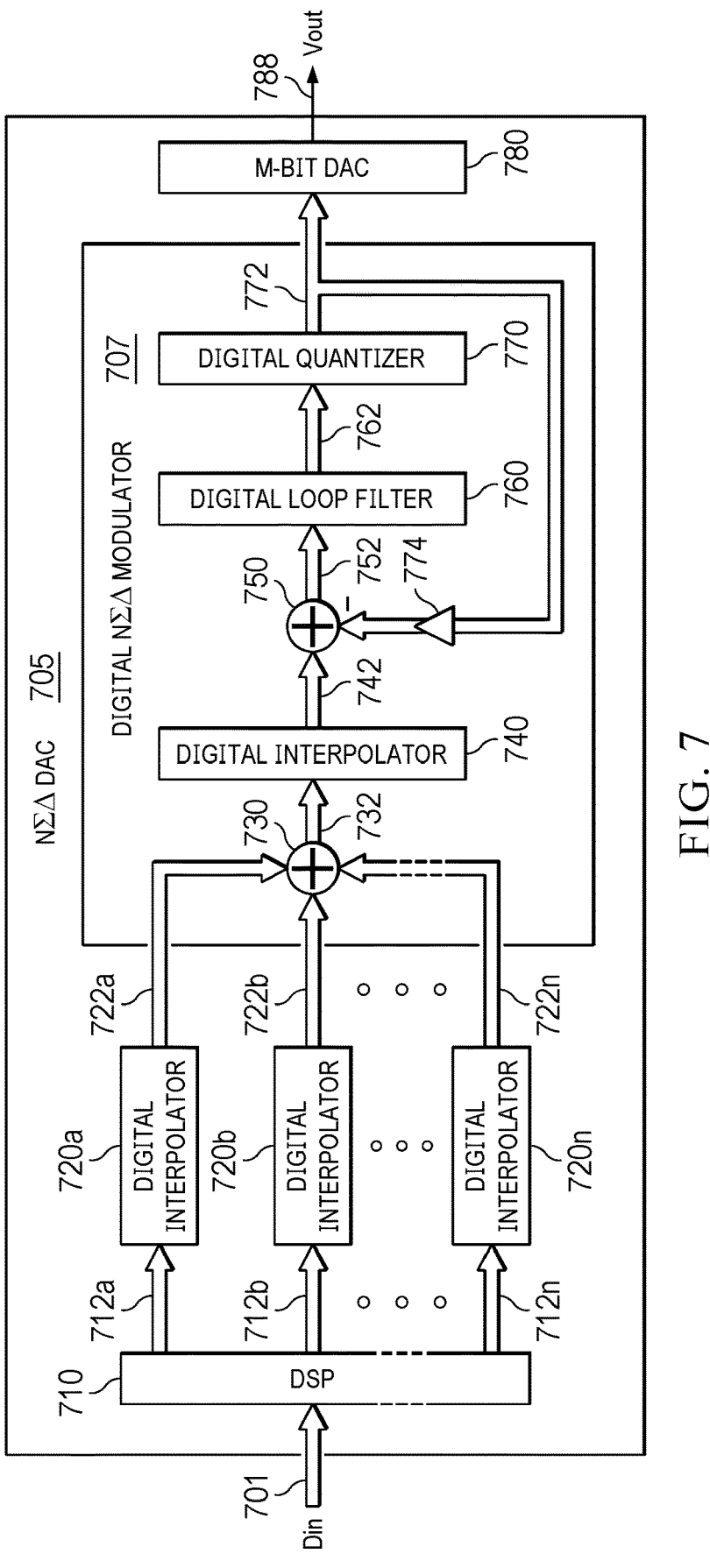
FIG. 7 depicts an NΣΔ digital to analog converter based on digital to analog NΣΔ modulator.

As discussed above, the architectures discussed above may be used with digital to analog conversion. FIG. 7 shows an NΣΔ digital to analog converter (NΣΔ DAC) (705) based on digital to analog NΣΔ modulator (707). The NΣΔ DAC may be used to convert digital signals (701) to analog (788).

The NΣΔ modulator (707) of FIG. 7 may comprise:

Multiple digital inputs (722a, 722b, . . . , 722n).

The first combiner (730) with multiple inputs (722a, 722b, . . . , 722n) and output (732).

The digital interpolator (740) with input (732) and an output (742). The interpolation rate may be arbitrary. A person skilled in the art will know how to select interpolation rate appropriate for selected architecture of the NΣΔ modulator (707). The digital interpolator (740) is optional and may not exist. In such case the input (732) may connect directly to output (742).

The second combiner (750) with an input (742) and input (774) that is a part of feedback.

The digital loop filter (760) with input (752) and output (762). The digital loop filter (760) may integrate (sum) results on the input (752) that are the outputs (752) of the second combiner (750). The digital loop filter (760) may also be any other digital filter.

The digital quantizer (770) with input (762) and output (772) may reduce the number of bits on the input (762) to M bits on the output (772).

The feedback scaler (774) with input (772) that is an output from the digital quantizer (770). The feedback scaler (774) may multiply the value on (772) with an arbitrary, usually negative, value.

The M-bit output (772).

The NΣΔ modulator in FIG. 7 operates as follows. The multiple digital inputs (722a, 722b, . . . , 722n) are combined (summed) in the first combiner (730). This may result in output (730) being bit-wise wider than inputs (722a, 722b, . . . , 722n). The digital signal on output of the first combiner (730) may be interpolated by the digital interpolator (740). Standard digital interpolation algorithms may be used. The interpolation may be multi stage or it may not exist (interpolation by factor 1). The summed (732) and interpolated (742) signals may be added to the feedback signal (772) multiplied by arbitrary value (774). The sum (752) may be filtered by digital filter (760), which may accumulate the outputs (752) from the second combiner (750). The output (762) from the digital loop filter (760) may be requantized by the digital quantizer (770) such that the number of bits on the output (772) is lower than on input (762).

The NΣΔ modulator in FIG. 7 may also operate as follows. The multiple digital inputs (722a, 722b, . . . , 722n) may be combined (summed) by the first combiner (730). The bit width of output (730) may be different, usually higher, than the bit width of (722a, 722b, . . . , 722n). The digital signal on output (732) of the first combiner (730) may be interpolated by the digital interpolator (740). Standard digital interpolation algorithms may be used. The interpolation may be multi stage. The interpolation may be arbitrary including by factor 1 (no interpolation). The interpolated output (742) may be added with input (774) that may be the feedback signal (772) multiplied by arbitrary value (774). The sum on the output (752) of the second combiner (750) may be filtered by digital filter (760), which may accumulate the outputs (752) from the second combiner (750). The output (762) from the digital loop filter (760) may be requantized by the digital quantizer (770) such that the number of bits on the output (772) is lower than on input (762).

The NΣΔ DAC (705) shown in FIG. 7 may comprise:

Digital input (701). The digital input (701) may be in quadrature with separate quadrature (I and Q) components or not.

Digital signal processing (DSP) block (710) that may perform digital signal processing algorithms.

Digital interpolators (720a, 720b, . . . , 720n) with inputs (712a, 712b, . . . , 712n) and outputs (722a, 722b, . . . , 722n).

The digital NΣΔ modulator (707) with inputs (722a, 722b, . . . , 722n) and output (772).

M-bit DAC (780) that performs conversion of M-bit digital signal on input (772) to analog signal on output (788).

Figure 9A:
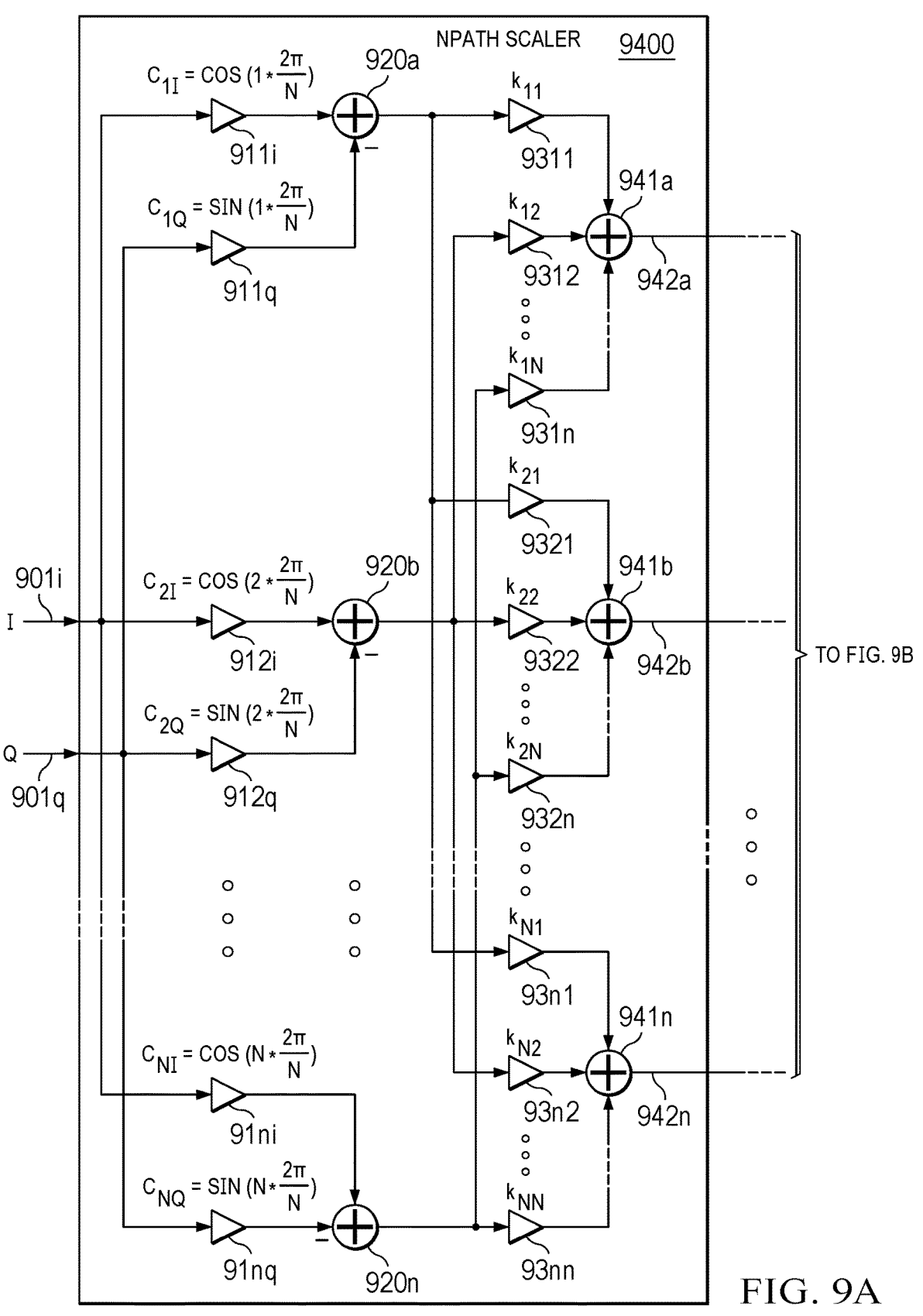
FIG. 9 (split in the figures as FIG. 9A and FIG. 9B) depicts a block diagram of an example of an N-path scaler.
Figure 9B:
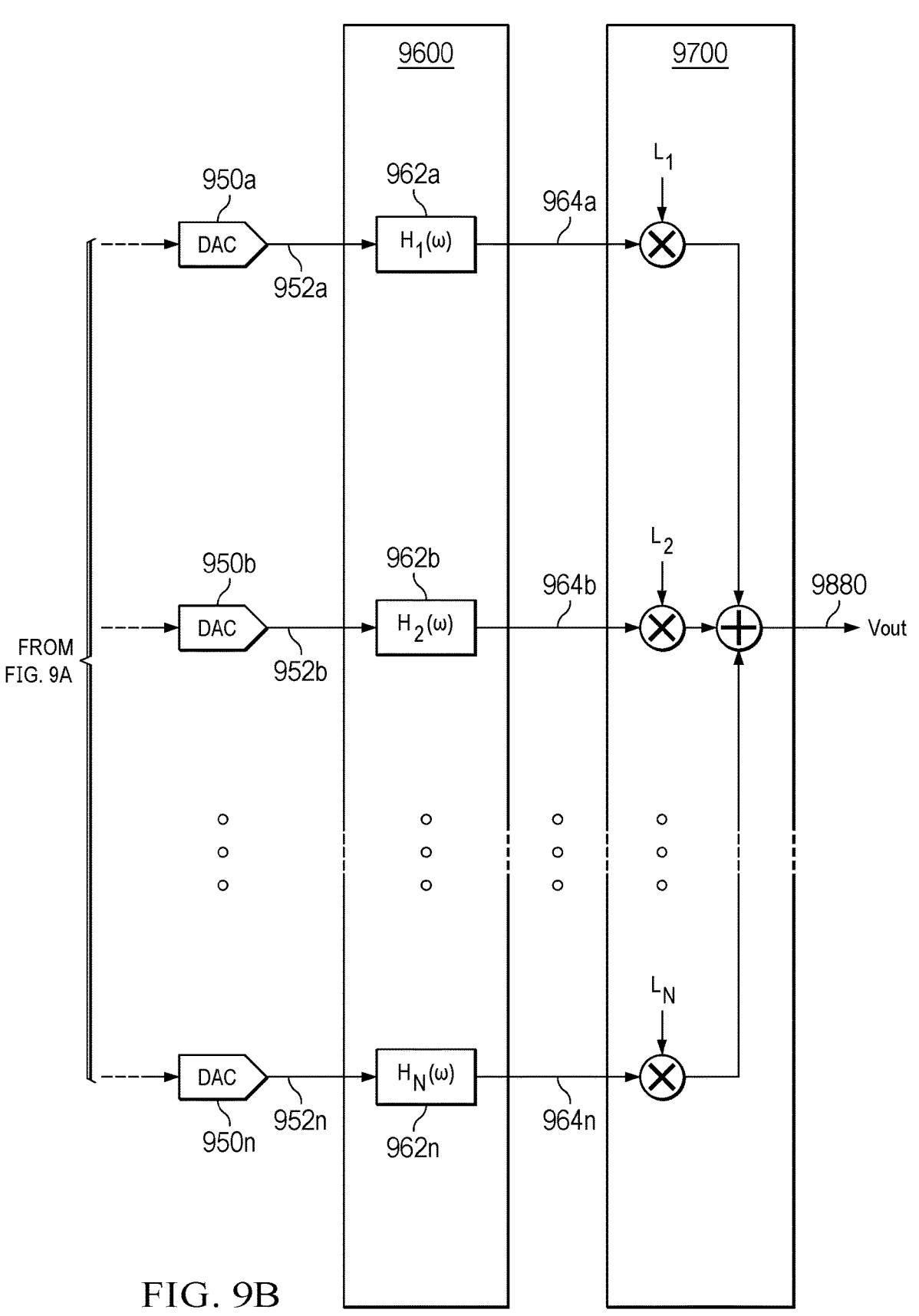

The NΣΔ DAC (705) in FIG. 7 operates as follows. The signal on digital input (701) may be processed by the digital signal processing corresponding to the N-path down conversion part (210) or N-path down conversion part (110b) or N-path scaler (FIG. 9: 9400). The implementation of (210), (110b), N-path scaler (FIG. 9: 9400) in digital logic and/or with digital signal processing will be apparent to one skilled in the art. The outputs (712a, 712b, . . . , 712n) of the digital signal processing (710) may be digitally interpolated using digital interpolation filters (720a, 720b, . . . , 720n). The digital interpolation may differ between (720a, 720b, . . . , 720n) and may be performed in multiple stages. The outputs (722a, 722b, . . . , 722n) of the digital interpolation filters (720a, 720b, . . . , 720n) may be inputs (722a, 722b, . . . , 722n) of the NΣΔ modulator (707). The output (772) of the NΣΔ modulator (707) is an input into M-bit digital to analog converter (780) that converts an M-bit digital signal to analog signal on the output (788).

Note that alternative architectures and topologies of the NΣΔ modulator (707) and NΣΔ DAC as will be known to one skilled in the art are possible including with higher order, multiple feedbacks, multi stage interpolators, etc.

Figure 8:
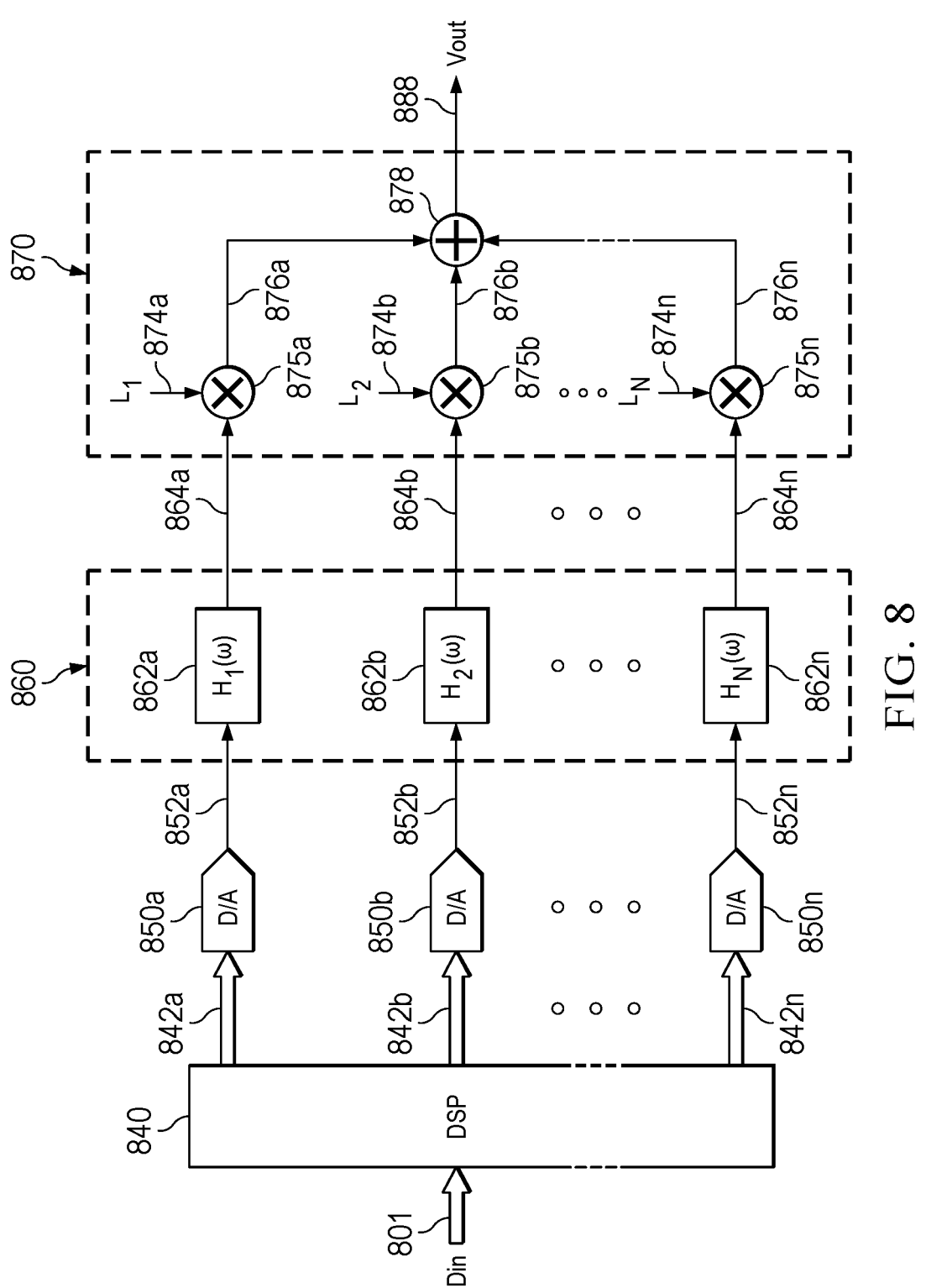
FIG. 8 depicts a conceptual diagram of digital to analog up conversion circuit.

FIG. 8 shows a conceptual diagram of digital to analog up conversion circuit. The disclosed circuit may be used as high frequency RF digital to analog converter (RF DAC). The disclosed circuit may also be used to implement the high frequency feedback loop in, e.g., FIG. 2a (2040, 2041, 2073, 2074, 2076) and other embodiments. The digital to analog up conversion circuit shown in FIG. 8 comprises:

Digital input (801). The digital input (801) may be in quadrature with separate quadrature (I and Q) components or not. The signals on input (801) may often (but not necessarily) be in base band or at low frequency.

The digital signal processing (DSP) (840) with input (801) and outputs (842a, 842b, . . . , 842n). The DSP (840) may perform such digital signal processing that the subsequent signal propagations from (842a, 842b, . . . , 842n) to output (888) result in the desired usually high frequency output (888).

An array of digital to analog converters (850a, 850b, . . . , 850n) with digital inputs (842a, 842b, . . . , 842n) and analog outputs (852a, 852b, . . . , 852n). The digital to analog converters (850a, 850b, . . . , 850n) may or may not be the same and may or may not be NΣΔ DAC's.

An array (860) of filters (862a, 862b, . . . , 862n) with inputs (852a, 852b, . . . , 852n) and outputs (864a, 864b, . . . , 864n). The filters may or may not have the same characteristics.

The N-path up conversion part (870) comprising of mixers (875a, 875b, . . . , 875n) with signal inputs (864a, 864b, . . . , 864n), phases inputs (874a, 874b, . . . , 874n) and outputs (876a, 876b, . . . , 876n) that may be combined (summed) by combiner (878) with output (888). The mixers may be implemented by full analog mixers. The mixers may also be realized by analog multipliers, simple switches, including CMOS switches or otherwise. The N-path up conversion part may be realized as, for example, shown in FIG. 1A (150a), FIG. 1B (150b), etc.

The output (888) may be analog output of the digital to analog up conversion circuit.

The digital to analog up conversion circuit shown in FIG. 8 operates as follows. The input (801) is digitally processed by DSP (840) in a way that the subsequent signal propagations from (842a, 842b, . . . , 842n) to output (888) result in the desired usually high frequency output (888). The DSP (840) may include interpolation and digital filtering. The signal on digital input (801) may be processed by the digital signal processing corresponding to the N-path down conversion part (210) or N-path down conversion part (110a), (110b) or N-path scaler (FIG. 9: 9400). The implementation of (210), (110a), (110b), N-path scaler (FIG. 9: 9400) in digital logic and/or with digital signal processing will be apparent to one skilled in the art.

The outputs (842a, 842b, . . . , 842n) of DSP (840) may be converted to analog signals (852a, 852b, . . . , 852n) by the digital to analog converters (850a, 850b, . . . , 850n). The outputs (852a, 852b, . . . , 852n) of the digital to analog converters (850a, 850b, . . . , 850n) may be filtered by array (860) of filters (862a, 862b, . . . , 862n). The filters (862a, 862b, . . . , 862n) may serve as anti-aliasing filters including optional noise/signal shaping and pulse matching circuitry. The filters (862a, 862b, . . . , 862n) may have low pass, band-pass or other characteristic and at the same time perform function as filters in FIG. 1A (130a), FIG. 1B (130b). The outputs (864a, 864b, . . . , 864n) of filters (862a, 862b, . . . , 862n) may be mixed with phases (874a, 874b, . . . , 874n) by mixers (875a, 875b, . . . , 875n). The phases may be as shown in FIG. 1C. The outputs (876a, 876b, . . . , 876n) of mixers (875a, 875b, . . . , 875n) may be combined (summed) by combiner (878) with output (888).

Note that it may be beneficial that input (801) is base band or low frequency. Further, it may be beneficial that whole signal chain before N-path up conversion part (870) operates at lower frequencies than N-path up conversion part (870). This may save power, reduce circuit complexity and improve characteristics. It may be beneficial that the filters (862a, 862b, . . . , 862n) may be low pass. This may save power, reduce circuit complexity and improve characteristics.

FIG. 9 shows a block diagram of an example of an N-path scaler. The N-path scaler (9400) shown in FIG. 9 may comprise:

Input (901i, 901q) that may be in quadrature with I component (901i) and Q component (901q).

An array of first I scalers (911i, 912i, . . . , 91ni) and first Q scalers (911q, 912q, 91nq). The first I scalers may multiply the input (901i) with the following values: (911i)=cos(1*2π/N), (912i)=cos(2*2π/N), . . . , (91ni)=cos(N*2π/N). The first Q scalers may multiply the input (901q) with the following values: (911q)=sin(1*2π/N), (912q)=sin(2*2π/N), . . . , (91nq)=sin(N*2π/N).

The array of second scalers (9311, 9312, . . . , 931n, 9321, 9322, . . . , 932n, . . . , 93n1, 93n2, 93nn) may be the coefficients $k_{pq}$ of matrix K. The matrix K coefficients may determine the particular characteristics and spectral shaping.

The N-path scaler (9400) outputs (942a, 942b, 942n)

The N-path scaler shown in FIG. 9 operates as follows. Input (901i) may be multiplied with I scalar values (911i, 912i, . . . , 91ni). Input (901q) may be multiplied with Q scalar values (911q, 912q, . . . , 912n). The I and Q multiples may be added together by adders (920a, 920b, . . . , 920n)

such that the outputs of the adders (920a, 920b, . . . , 920n) equal (920a)=(901i)*(911i)-(901q)*(911q), (920b)=(901i)* (912i)-(901q)*(912q), . . . , (920n)=(901i)*(91ni)-(901q)* (91nq).

The outputs of adders (920a, 920b, . . . , 920n) may be multiplied by coefficients of matrix K so that output of adder (920a) may be multiplied by (9311, 9321, . . . , 93n1), and that output of the adder (920b) may be multiplied by (9312, 9322, . . . , 93n2), and so on and so forth including the output of the adder (920n) which may be multiplied by (931n, 932n, . . . , 93nn). The signals multiplied by scalars (9311, 9312, . . . , 931n) may be added together by adder 941a, and the signals multiplied by scalars (9321, 9322, . . . , 932n) may be added together by adder 941b, and so on and so forth including the signals multiplied by scalars (93n1, 93n2, . . . , 93nn) which may be added together by the adder (941n). The outputs (942a, 942b, . . . , 942n) of the N-path scaler (9400) are the outputs of adders (941a, 941b, . . . , 941n).

Note that the coefficients of matrix K may determine the spectral characteristics. Also note that some paths may not need to be implemented (e.g. due to scaling with value 0). Also note that different permutations and different values of matrix K coefficients (9311, . . . , 93nn), I scalar values (911i, 912i, . . . , 91ni) and Q scalar values (911q, 912q, . . . , 91nq) are possible. The alternative values may be analytically or otherwise determined such that the output characteristics are as required for particular application.

In some embodiments, quadrature input with inputs (901i) and (901q) may be replaced with non-quadrature (real) input. It will be apparent to one skilled in the art that one possibility may be convert the single (real) input into quadrature inputs (901i) and (901q) using i.e. Hilbert transform. Such transformations may apply also to other embodiments disclosed here. Similarly, it will be apparent to one skilled in the art that certain operations may be combined (two subsequent multiplications may be merged, or may be further separated, etc.). The paths multiplied with value zero may not need to be implemented, etc.

An NΣΔ DAC implemented via the architecture shown in FIG. 9 may comprise:

Quadrature input I (901i) and Q (901q).

N-path scaler (9400) with input I (901i) and Q (901q) and outputs (942a, 942b, . . . , 942n). The N-path scaler (9400) may be as previously described. An array of digital to analog converters (950a, 950b, . . . , 950n) with digital inputs (942a, 942b, . . . , 942n) and analog outputs (952a, 952b, . . . , 952n).

An array of filters (9600) comprising of filters (962a, 962b, . . . , 962n).

The filters (962a, 962b, . . . , 962n) with inputs (952a, 952b, . . . , 952n) and outputs (964a, 964b, . . . , 964n) may have the same or distinct characteristics and may function also as antialiasing or Nyquist zone selection filters.

The N-path up conversion part (9700) with inputs (964a, 964b, . . . , 964n) and an output (9880). The N-path up conversion part (9700) may operate as previously described.

An NΣΔ DAC implemented via the architecture shown in FIG. 9 operates as follows. Quadrature input I (901i) and Q (901q) may be processed by the N-path scaler (9400) as previously described. The outputs (942a, 942b, . . . , 942n) of the N-path scaler (9400) may be converted from digital to analog signals by the array of digital to analog converters (950a, 950b, . . . , 950n) filtered by a filter array (9600) of possibly distinct filters (962a, 962b, . . . , 962n) and upconverted by the N-path up conversion part (9700). The N-path up conversion part (9700) may operate as previously described.

Note that the architecture of the NΣΔ DAC as disclosed may enable the DAC's (950*a*, 950*b*, . . . , 950*n*) operate at lower frequencies, while still maintaining output (9880) at high frequency. This may save power, reduce circuit complexity, cost, area and may improve the characteristics. Also note that the N-path scaler (9400) may be implemented using digital logic at lower frequency comparing to output (9880). This may save power, reduce circuit complexity, cost, area and may improve the characteristics.

Figure 10:
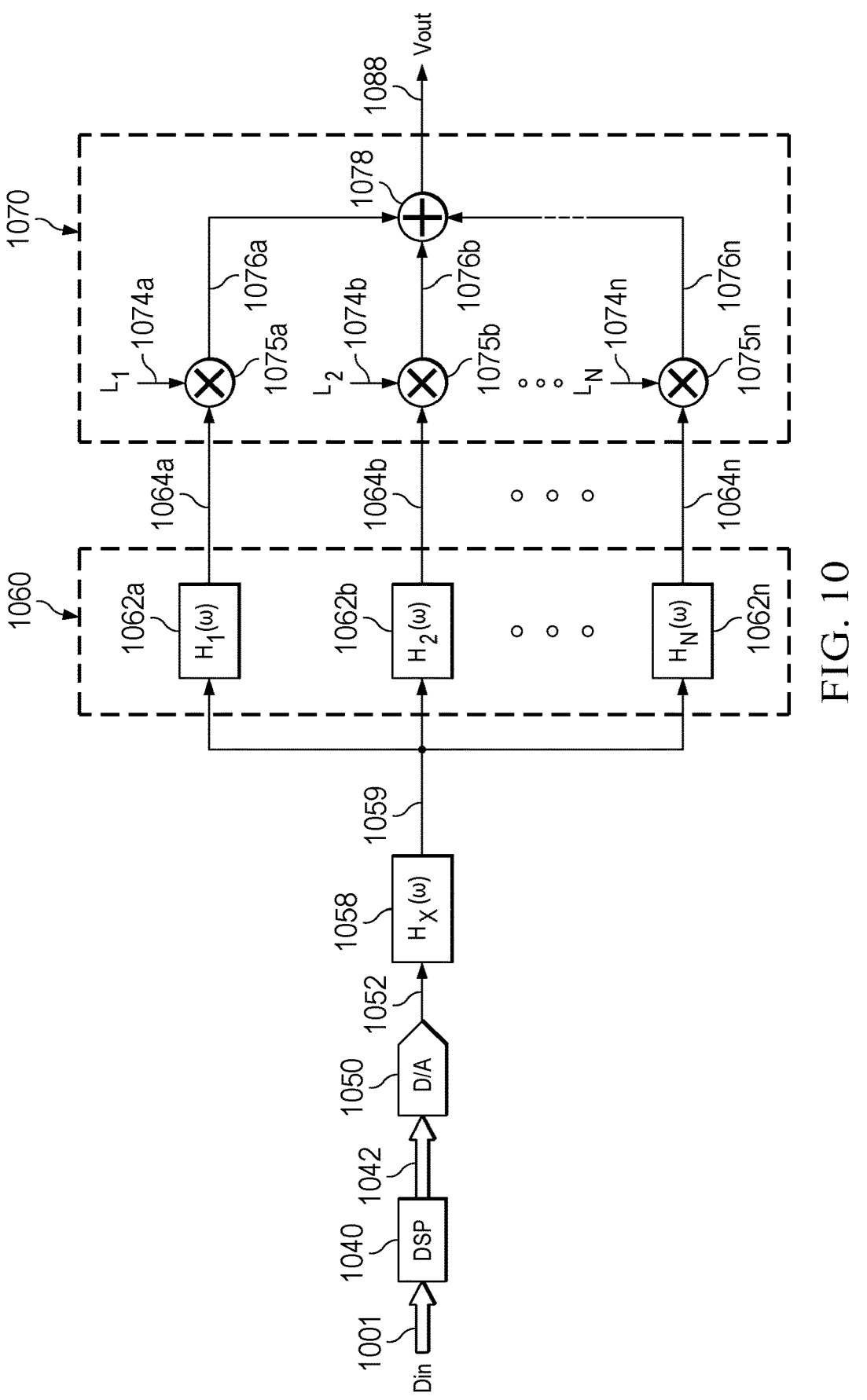
FIG. 10 depicts a conceptual block diagram of single DAC digital to analog up conversion circuit.

FIG. 10 shows a conceptual block diagram of single DAC digital to analog up conversion circuit. The disclosed circuit may be used as high frequency RF digital to analog converter (RF DAC). The disclosed circuit may also be used to implement the high frequency feedback loop in e.g. FIG. 2*a* (2040, 2041, 2073, 2074, 2076) and other embodiments.

The single DAC digital to analog up conversion circuit of FIG. 10 comprises:

Digital input (1001). The digital input (1001) may be in quadrature with separate quadrature (I and Q) components or not. The signals on input (1001) may often (but not necessarily) be in base band or at low frequency.

The digital signal processing (DSP) (1040) with input (1001) and output (1042). The DSP (1040) may perform such digital signal processing that the rest of the signal paths results in the desired usually high frequency output (1088).

A single digital to analog converter (1050) with digital input (1042) and analog output (1052). The digital to analog converter (1050) may or may not be NΣΔ DAC.

A first filter (1058) that is optional may not exist. The first filter (1058) may or may not perform an anti-aliasing function.

An array (1060) of filters (1062*a*, 1062*b*, . . . , 1062*n*) with inputs (1059) and outputs (1064*a*, 1064*b*, . . . , 1064*n*). The filters may usually but not necessarily have distinct characteristics.

The N-path up conversion part (1070) comprising of mixers (1075*a*, 1075*b*, . . . , 1075*n*) with signal inputs (1064*a*, 1064*b*, . . . , 1064*n*), phases inputs (1074*a*, 1074*b*, . . . , 1074*n*) and outputs (1076*a*, 1076*b*, . . . , 1076*n*) that may be combined (summed) by combiner (1078) with output (1088). The mixers may be implemented by full analog mixers. The mixers may also be realized by analog multipliers, simple switches, including CMOS switches or otherwise. The N-path up conversion part may be realized as shown in FIG. 1A (150*a*), FIG. 1B (150*b*) etc.

The output (1088) may be analog output of the digital to analog up conversion circuit.

The single DAC digital to analog up conversion circuit of FIG. 10 operates as follows. The input (1001) is digitally processed by DSP (1040) in a way that the rest of the signal paths results in the desired usually high frequency output (1088). The DSP (1040) may include interpolation and digital filtering. The signal on digital input (1001) may be processed by the digital signal processing corresponding to the N-path down conversion part (210) or N-path down conversion part (110*a*), (110*b*) or N-path scaler (9400). The multiple outputs of (210), (110*a*), (110*b*), N-path scaler (9400) may be combined into single output (1042) by addition and/or time interleaving and/or otherwise. Comparing to the example of FIG. 8, the DSP may need to perform additional interpolation. The implementation of (210), (110*a*), (110*b*), N-path scaler (9400) in digital logic and/or with digital signal processing will be apparent to one skilled in the art.

The output (1042) of DSP (1040) may be converted to analog signal (1052) by the digital to analog converter (1050). The output (1052) of the digital to analog converter (1050) may be filtered by first filter (1058) and may have low pass, band pass or arbitrary other characteristic. The output (1059) of the first filter (1058) may be an input into array (1060) of filters (1062*a*, 1062*b*, . . . , 1062*n*). The filters (1062*a*, 1062*b*, . . . , 1062*n*) may serve as anti-aliasing filters. The filters (1062*a*, 1062*b*, . . . , 1062*n*) may have low pass, band-pass or arbitrary other characteristic and at the same time perform function as filters in FIG. 1A (130*a*), FIG. 1B (130*b*). The filters (1062*a*, 1062*b*, . . . , 1062*n*) may also reverse the DSP (1040) operation of combining outputs by addition and/or time interleaving and/or otherwise. The outputs (1064*a*, 1064*b*, . . . , 1064*n*) of filters (1062*a*, 1062*b*, . . . , 1062*n*) may be mixed with phases (1074*a*, 1074*b*, . . . , 1074*n*) by mixers (1075*a*, 1075*b*, . . . , 1075*n*). The phases may be as shown in FIG. 1C. The outputs (1076*a*, 1076*b*, . . . , 1076*n*) of mixers (1075*a*, 1075*b*, . . . , 1075*n*) may be combined (summed) by combiner (1078) with output (1088).

Figure 11:
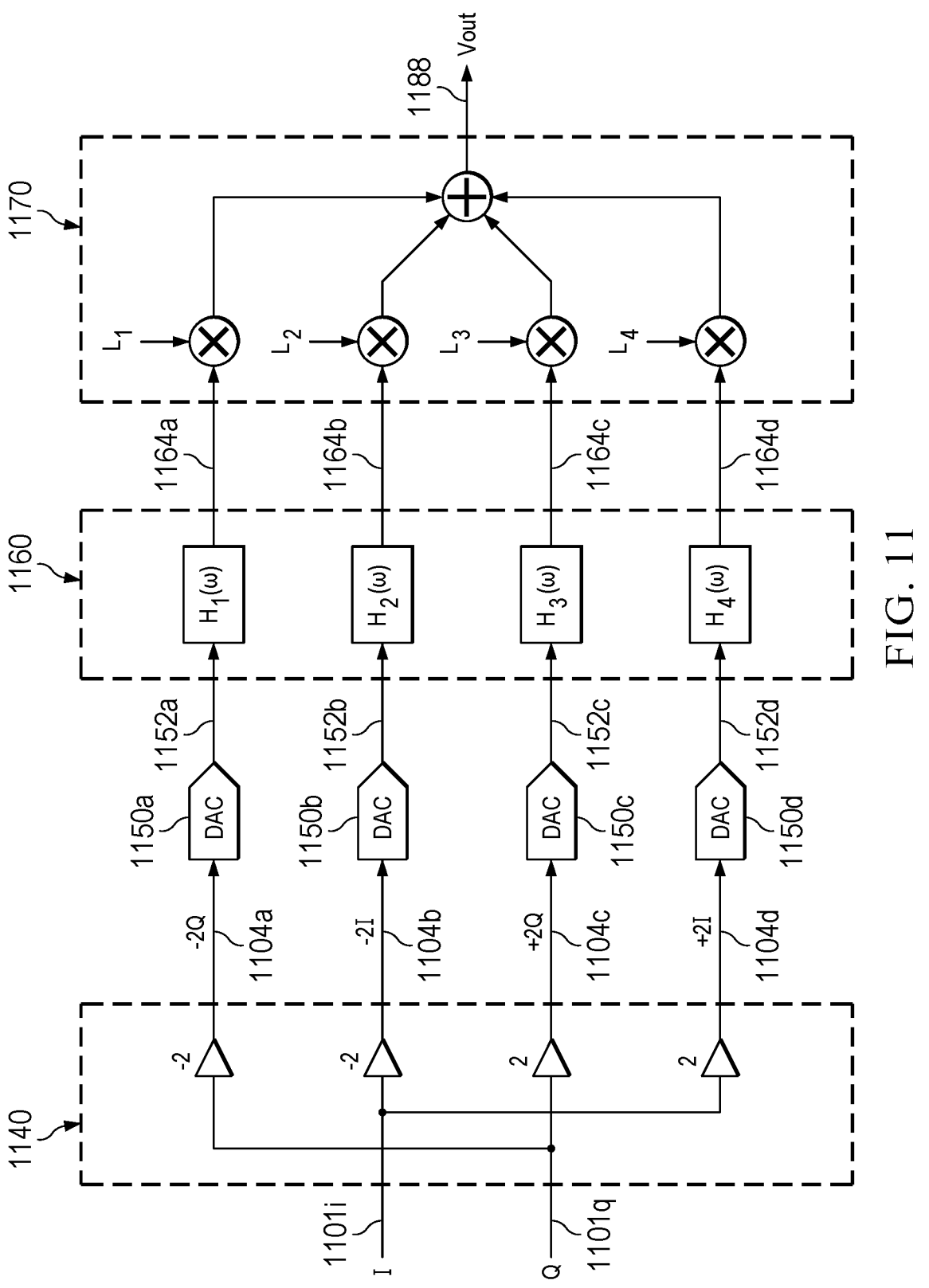
FIG. 11 depicts a block diagram of an NΣΔ DAC.

One possible example of an NΣΔ DAC embodiment described in FIG. 9 may be as shown in FIG. 11. In the example of N=4 and matrix K=K$_4$ as shown below, the embodiment may be as shown in FIG. 11.

$$K_4 = \begin{bmatrix} 1 & 0 & -1 & 0 \\ 0 & 1 & 0 & -1 \\ -1 & 0 & 1 & 0 \\ 0 & -1 & 0 & 1 \end{bmatrix}$$

A possible NΣΔ DAC embodiment, where N=4 may comprise:

The inputs I (1101*i*) and Q (1101*q*) may be in quadrature.

The complete N-path scaler from FIG. 9 (9400), which may simplify to (1140). Even further simplifications may be possible as factor»2«is common to all paths and can thus be exposed, eliminated or taken into account in a different way (e.g. common multiplication, renormalization, . . . ). Furthermore the N-path scaler (1140) may be further optimized in case of differential I (1101*i*) input and differential (1101*q*) inputs by taking advantage of differential signaling to eliminate multiplication by»−1«.

The digital to analog converters (1150*a*, 1150*b*, 1150*c*, 1150*d*) that convert the digital signals (1104*a*, 1104*b*, 1104*c*, 1104*d*) into analog output signals (1152*a*, 1152*b*, 1152*c*, 1152*d*) that may be further filtered by array of filters (1160). The filters may have low pass, band pass or other characteristic. In some embodiments the filters may have the same low pass characteristic.

The outputs (1164*a*, 1164*b*, 1164*c*, 1164*n*) of the array of filters (1160) may be input into N-path up conversion part (1170) with four phases. The phases may be as shown in FIG. 1C.

The output of the N-path up conversion part (1170) may be an output (1188) of the NΣΔ DAC Although the invention has been described with respect to specific embodiments thereof, these embodiments are merely illustrative, and not restrictive of the invention as a whole. Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention.

Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Software implementing embodiments disclosed herein may be implemented in suitable computer-executable instructions that may reside on a computer-readable storage medium. Within this disclosure, the term "computer-readable storage medium" encompasses all types of data storage medium that can be read by a processor. Examples of computer-readable storage media can include, but are not limited to, volatile and non-volatile computer memories and storage devices such as random access memories, read-only memories, hard drives, data cartridges, direct access storage device arrays, magnetic tapes, floppy diskettes, flash memory drives, optical data storage devices, compact-disc read-only memories, hosted or cloud-based storage, and other appropriate computer memories and data storage devices.

Those skilled in the relevant art will appreciate that the invention can be implemented or practiced with other computer system configurations including, without limitation, multi-processor systems, network devices, mini-computers, mainframe computers, data processors, and the like. The invention can be employed in distributed computing environments, where tasks or modules are performed by remote processing devices, which are linked through a communications network such as a LAN, WAN, and/or the Internet. In a distributed computing environment, program modules or subroutines may be located in both local and remote memory storage devices. These program modules or subroutines may, for example, be stored or distributed on computer-readable media, including magnetic and optically readable and removable computer discs, stored as firmware in chips, as well as distributed electronically over the Internet or over other networks (including wireless networks).

Embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention. At least portions of the functionalities or processes described herein can be implemented in suitable computer-executable instructions. The computer-executable instructions may reside on a computer readable medium, hardware circuitry or the like, or any combination thereof.

Any suitable programming language can be used to implement the routines, methods or programs of embodiments of the invention described herein, including C, C++, Java, JavaScript, HTML, or any other programming or scripting code, etc. Different programming techniques can be employed such as procedural or object oriented. Other software/hardware/network architectures may be used. Communications between computers implementing embodiments can be accomplished using any electronic, optical, radio frequency signals, or other suitable methods and tools of communication in compliance with known network protocols.

As one skilled in the art can appreciate, a computer program product implementing an embodiment disclosed herein may comprise a non-transitory computer readable medium storing computer instructions executable by one or more processors in a computing environment. The computer readable medium can be, by way of example only but not by limitation, an electronic, magnetic, optical or other machine readable medium. Examples of non-transitory computer-readable media can include random access memories, read-only memories, hard drives, data cartridges, magnetic tapes, floppy diskettes, flash memory drives, optical data storage devices, compact-disc read-only memories, and other appropriate computer memories and data storage devices.

Particular routines can execute on a single processor or multiple processors. Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, or otherwise controlled by another process, such as an operating system, kernel, etc. Functions, routines, methods, steps and operations described herein can be performed in hardware, software, firmware or any combination thereof.

It will also be appreciated that one or more of the elements depicted in the drawings/figures can be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited to only those elements but may include other elements not expressly listed or inherent to such process, product, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the meaning of "in" includes "in" and "on" unless the context clearly dictates otherwise.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms. Language designating such nonlimiting examples and illustrations includes, but is not limited to: "for example," "for instance," "e.g.," "in one embodiment."

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Generally then, although the invention has been described with respect to specific embodiments thereof, these embodiments are merely illustrative, and not restrictive of the invention. Rather, the description is intended to describe illustrative embodiments, features and functions in order to provide a person of ordinary skill in the art context to understand the invention without limiting the invention to any particularly described embodiment, feature or function, including any such embodiment feature or function described. While specific embodiments of, and examples for, the invention are described herein for illustrative purposes only, various equivalent modifications are possible within the spirit and scope of the invention, as those skilled in the relevant art will recognize and appreciate.

As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

What is claimed is:

1. A multi-path sigma delta modulator for generating a digital output signal from a high frequency input signal, the multi path sigma delta modulator converter comprising:

an N-path down converter for downconverting the high frequency input signal, the N-path down converter further comprising a plurality of paths forming N signal propagation paths, each signal propagation path filtering and scaling the high frequency input signal via a plurality of programmable weight coefficients, wherein the programmable weight coefficients are configured to select a center frequency of the N-path down converter, wherein outputs of each of the signal propagation paths are combined to form a combined output; and a quantizer for digitizing the combined output to generate a digital output signal.

2. The multi-path sigma delta modulator of claim 1, further comprising a digital decimation filter for filtering the generated digital output signal.

3. The multi-path sigma delta modulator of claim 1, wherein the output of each respective signal propagation path is combined with a feedback signal.

4. The multi-path sigma delta modulator of claim 3, wherein the feedback signal is derived from the digital output signal.

5. The multi-path sigma delta modulator of claim 1, wherein the output of each respective signal propagation path is scaled before being combined with other outputs.

6. The multi-path sigma delta modulator of claim 1, wherein the N-path down converter applies signal transformation characteristics to the high frequency input signal.

7. The multi-path sigma delta modulator of claim 5, wherein the N-path down converter is configured to achieve desired signal transformation characteristics.

8. The multi-path sigma delta modulator of claim 1, wherein the combined output is further combined with a second feedback signal prior to being digitized.

9. The multi-path sigma delta modulator of claim 8, wherein the second feedback signal is derived from the digital output signal.

10. A multi-path sigma delta modulator for generating a desired high frequency analog output signal from a digital input signal, the multi path sigma delta modulator converter comprising:

an N-path scaler for preparing the digital input signal such that an output of the sigma delta modulator is the desired high frequency analog output signal, the N-path scaler comprising a plurality of programmable weight coefficients to define a spectral characteristic of the N-path scaler;

a quantizer operatively coupled to the N-path scaler, the quantizer having a digital input and a digital output, wherein the digital output has a lower number of bits than the digital input; and a DAC operatively coupled to the quantizer for converting the digital output of the quantizer to an analog signal.

11. The multi-path sigma delta modulator of claim 10, further comprising a combiner for combining a plurality of digital signals into a single digital signal.

12. The multi-path sigma delta modulator of claim 11, further comprising a second combiner for combining the single digital signal with a feedback signal from the N-path scaler.

13. The multi-path sigma delta modulator of claim 12, wherein the feedback signal is derived from the digital output of the quantizer.

14. The multi-path sigma delta modulator of claim 12, further comprising a digital loop filter coupled between the second combiner and the quantizer for filtering an output of the second combiner.

15. A method for generating a digital output signal from a high frequency input signal using a multi path sigma delta modulator converter, the method comprising:

downconverting, by an N-path down converter, the high frequency input signal, the N-path down converter comprising a plurality of paths forming N signal propagation paths, each signal propagation path filtering and scaling the high frequency input signal via a plurality of programmable weight coefficients, wherein the programmable weight coefficients are configured to select a center frequency of the N-path down converter, wherein outputs of each of the signal propagation paths are combined to form a combined output; and generating, by a quantizer, a digital output signal from the combined output.

16. The method of claim 15, further comprising filtering, by a digital decimation filter, the generated digital output signal.

17. The method of claim 15, combining the output of each respective signal propagation path with a feedback signal.

18. The method of claim 17, wherein the feedback signal is derived from the digital output signal.

19. The method of claim 15, wherein the output of each respective signal propagation path is scaled before being combined with other outputs.

20. The method of claim 15, wherein the combined output is further combined with a second feedback signal prior to being digitized.

\* \* \* \* \*